(12) United States Patent
Saito et al.

(10) Patent No.: US 8,436,333 B2
(45) Date of Patent: May 7, 2013

(54) SILICON LIGHT EMITTING DIODE, SILICON OPTICAL TRANSISTOR, SILICON LASER AND ITS MANUFACTURING METHOD

(75) Inventors: Shinichi Saito, Kawasaki (JP); Digh Hisamoto, Kokubunji (JP); Tadashi Arai, Kumagaya (JP); Takahiro Onai, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 859 days.

(21) Appl. No.: 11/790,283

(22) Filed: Apr. 24, 2007

(65) Prior Publication Data

US 2008/0128713 A1 Jun. 5, 2008

(30) Foreign Application Priority Data

Apr. 25, 2006 (JP) ................. 2006-120065

(51) Int. Cl.
*H01L 29/06* (2006.01)
(52) U.S. Cl.
USPC .......... 257/13; 257/79; 257/86; 257/E33.005; 257/E33.015
(58) Field of Classification Search ............ 257/13, 257/79, 86; 438/22
See application file for complete search history.

(56) References Cited

U.S. PATENT DOCUMENTS

| | | | | |
|---|---|---|---|---|
| 4,146,906 A | * | 3/1979 | Miyata et al. | 257/172 |
| 4,163,240 A | * | 7/1979 | Swinehart et al. | 257/430 |
| 4,590,501 A | * | 5/1986 | Scholl | 257/94 |
| 5,466,948 A | * | 11/1995 | Worley | 257/84 |
| 5,523,592 A | * | 6/1996 | Nakagawa et al. | 257/96 |
| 5,629,534 A | * | 5/1997 | Inuzuka et al. | 257/84 |
| 5,726,464 A | * | 3/1998 | Kumomi et al. | 257/94 |
| 6,570,187 B1 | * | 5/2003 | Pautrat et al. | 257/79 |
| 7,393,411 B2 | * | 7/2008 | Ichinose et al. | 117/101 |
| 7,601,941 B2 | * | 10/2009 | Fuyuki | 250/214 R |
| 2004/0164370 A1 | * | 8/2004 | Kim et al. | 257/458 |
| 2005/0017257 A1 | | 1/2005 | Green et al. | |

(Continued)

FOREIGN PATENT DOCUMENTS

| | | | |
|---|---|---|---|
| JP | 2-51280 | * | 2/1990 |
| JP | 4-25184 | * | 4/1992 |

(Continued)

OTHER PUBLICATIONS

R. Chan et al., "Collector current map of gain and stimulated recombination on the base quantum well transitions of a transistor laser", Applied Physics Letters 2006, vol. 88, pp. 143508-1-143508-3.

(Continued)

*Primary Examiner* — A. Sefer
(74) *Attorney, Agent, or Firm* — Miles & Stockbridge P.C.

(57) ABSTRACT

A light-emitting device according to the present invention includes a first electrode unit for injecting an electron, a second electrode unit for injecting a hole, and light-emitting units and electrically connected to the first electrode unit and the second electrode unit respectively, wherein the light-emitting units and are formed of single-crystal silicon, the light-emitting units and having a first surface (topside surface) and a second surface (underside surface) opposed to the first surface, plane orientation of the first and second surfaces being set to a (100) plane, thicknesses of the light-emitting units and in a direction orthogonal to the first and second surfaces being made extremely thin.

7 Claims, 25 Drawing Sheets

U.S. PATENT DOCUMENTS

| | | | |
|---|---|---|---|
| 2007/0145394 A1* | 6/2007 | Shimizu et al. | 257/98 |
| 2008/0197362 A1* | 8/2008 | Hisamoto et al. | 257/86 |
| 2009/0090925 A1* | 4/2009 | Saito et al. | 257/98 |
| 2010/0052089 A1* | 3/2010 | Golan et al. | 257/458 |

FOREIGN PATENT DOCUMENTS

| | | | |
|---|---|---|---|
| JP | 5-29651 | * | 5/1993 |
| JP | 6-45644 | * | 2/1994 |
| JP | 6-140669 | * | 6/1994 |
| JP | 63-10810 | * | 11/1994 |
| JP | 09-045915 | | 2/1997 |
| JP | 11-46014 | * | 2/1999 |
| JP | 11-274615 | * | 10/1999 |
| JP | 2004-527921 | | 9/2004 |
| JP | 2004-319668 | | 11/2004 |

OTHER PUBLICATIONS

L. T. Canham, "Silicon quantum wires array fabrication by electrochemical and chemical dissolution of wafers", Applied Physics Letters, Sep. 3, 1990, vol. 57, pp. 1046-1048.

S. Coffa et al., "High efficiency and fast modulation of Er-doped light emitting Si diodes", Applied Physics Letters, Sep. 30, 1996, vol. 69, pp. 2077-2079.

Fabio Iacona, "Silicon nanocrystals and $Er^{3+}$ ions in an optical microcavity", Journal of Applied Physics, Jun. 15, 2001, vol. 89, No. 12, pp. 8354-8356.

Salvatore Coffa, "Light From Silicon", IEEE Spectrum, Oct. 2005, pp. 44-49.

* cited by examiner

Integrated intensity

Peak wavelength

Optional intermediate i-type semiconductor region (1)

(2)

SILICON LIGHT EMITTING DIODE, SILICON OPTICAL TRANSISTOR, SILICON LASER AND ITS MANUFACTURING METHOD

BACKGROUND OF THE INVENTION

The present application claims priority from Japanese application JP-A-2006-120065 filed on Apr. 25, 2006, the content of which is hereby incorporated by reference into this application.

FIELD OF THE INVENTION

The present invention relates to a light-emitting device using silicon. More particularly, it relates to a high-luminance light-emitting diode, an optical transistor whose light intensity/wavelength is controllable with the gate voltage, a silicon laser, and their manufacturing method.

DESCRIPTION OF THE RELATED ART

In broadband networks which support the Internet industry, optical communications are employed. Lasers using III-V or II-VI compound semiconductors are used for light transmission/reception in the optical communications.

Although various types of structures have been advocated for the compound semiconductor lasers, the most common one is the double hetero structure. The double hetero structure is a structure such that, using two types of different compound semiconductors, the compound semiconductor with a smaller bandgap is sandwiched between the compound semiconductors with larger bandgaps. When fabricating the double hetero structure, these respective compound semiconductors, i.e., the n-type compound semiconductor, the none doped i-type compound semiconductor, and the p-type compound semiconductor, are epitaxially grown continuously on a substrate, thereby being multi-layered in the vertical direction. At this time, there is a need of paying attention to the band structure of the none doped i-type compound semiconductor sandwiched in between. This means that the following conditions are important: The bandgap of the i-type compound semiconductor is smaller than the ones of the n-type and p-type compound semiconductors, and conduction-band level of the i-type semiconductor is lower than conduction-band level of the n-type semiconductor, and valence-band level of the i-type semiconductor is higher than valence-band level of the p-type semiconductor. Namely, the structure is formed so that both electrons and holes will be confined into the i-type region. On account of this, the electrons and the holes become likely to stay in the same i-type region. Accordingly, the probability enhances that the electrons and the holes collide with each other thus to be subjected to pair annihilations. As a result, it becomes possible to increase the light-emission efficiency. Also, the refractive index tends to become larger as the bandgap becomes smaller. Consequently, it turns out that the light as well will be confined into the i-type compound semiconductor by selecting materials where the refractive index of the i-type compound semiconductor is smaller than the ones of the n-type and p-type compound semiconductors. Then, the confined light effectively stimulates recombination of the electrons and the holes which form population inversion, thereby bringing about implementation of laser oscillation.

Based on the optical communications using the compound semiconductors which emit light effectively in this way, long-distance information communications are currently performed in an instantaneous manner and in large amounts. Namely, at present, information processing and storage are performed on the silicon-based LSIs; whereas information transmission is performed with the compound-semiconductor-based lasers.

If silicon could be caused to emit light with a high efficiency, both the electronic devices and the light-emitting devices could be integrated on a silicon chip. This prospect promises tremendous industrial values. Accordingly, researches for permitting silicon to emit light are being performed energetically on a large scale.

However, it is difficult to cause silicon to emit light with a high efficiency, because silicon has the indirect-transition band structure. The indirect-transition band structure refers to a band structure where either of the momentum at which energy in the conduction band becomes the minimum and the momentum at which energy in the valence band becomes the minimum is not equal to zero. In the case of silicon, although the minimum energy point in the valence band is the Γ point at which the momentum becomes equal to zero, the minimum energy point in the conduction band is not at the Γ point, but is positioned between the Γ point and the X point. More concretely, defining $k_0 = 0.85*\pi/a$ where a denotes the lattice constant, the minimum energy point in the conduction band exists in a degenerated manner over six points of $(0, 0, \pm k_0)$, $(0, \pm k_0, 0)$, and $(\pm k_0, 0, 0)$ FIG. 1A illustrates this degenerated manner of existence.

In contrast thereto, many of the compound semiconductors are referred to as direct-transition semiconductors. The reason for this is that, in each of them, the minimum energy point is positioned at the Γ point both in the conduction band and in the valence band.

Next, the explanation will be given below concerning why the light-emission efficiency is bad in the indirect-transition semiconductors, and the light-emission efficiency is good in the direct-transition semiconductors.

As described above, causing a semiconductor device to emit light requires that an electron and a hole collide with each other thus to be subjected to pair annihilation, and that the difference in energy therebetween be extracted as light. At this time, both of the conservation law of energy and the conservation law of momentum must be satisfied. The electron has its energy level within the conduction band, while the hole has the energy level of a portion at which the electron is absent within the valence band. The difference between both of the energy levels becomes equal to the energy that the light has. Also, wavelength of the light comes to differ depending on the energy thereof. As a result, it turns out that the energy difference between the conduction band and the valence band, i.e., magnitude of the bandgap therebetween, determines the wavelength of the light, i.e., color of the light. Considering the energy aspect in this way, no specific difficulty can be found out in the establishment of the conservation law of energy.

On the other hand, the momentum must also be conserved, because the collision phenomenon of the electron and the hole is related with the light emission. According to quantum mechanics, which is the physical law that governs the microscopic world, an electron, a hole, and a photon (i.e., quantum of light) are all waves as well as particles, but are scattered as the particles. As a result, the conservation law of momentum is established. The momentum is, qualitatively, a scale of quantifying with about how much impetus a particle will be flipped and repelled at the time of a collision concerned therewith. Estimating the momentum of a photon inside a crystal from the dispersion relationship of light ($\omega = ck$, where $\omega$ is angular frequency of light, c is velocity of light, and k is momentum of photon) and the energy of light indicates that the momentum of the photon becomes equal to substantially zero. Here, there might exist a phenomenon that the collision of a matter with light will flip and repel the matter. The above-described estimation result, however, means that this phenomenon exerts almost no influences on the scattering of the matter. This is in agreement with our intuition as well.

On the other hand, a hole also has little momentum, since the minimum energy point of the hole is also positioned at the Γ point. Inside silicon which is included in the indirect-transition semiconductors, however, an electron seldom exists at the Γ point, but exists at the minimum energy point in proximity to the X point. As a result, the electron has the significantly large amount of momentum of as much as $k_0=0.85*\pi/a$.

Accordingly, inside silicon, the momentum conservation law and the energy conservation law cannot be satisfied simultaneously in the process in which an electron and a hole collide with each other simply. Consequently, it turns out that only an electron/hole pair, which has managed to simultaneously satisfy the momentum conservation law and the energy conservation law, will be successfully converted into light. At this time, such an electron/hole pair simultaneously satisfies both laws by, e.g., absorbing or emitting a phonon, i.e., quantum of lattice vibration inside a crystal. Although it cannot be assured that the process like this does not exist physically, the probability is low that such a phenomenon will take place. This is because such a phenomenon is a higher-order scattering process in which an electron, a hole, a photon, and a phonon collide with each other simultaneously. Consequently, it has been known that silicon, which is the indirect-transition semiconductor, exhibits an extremely bad light-emission efficiency.

In contrast thereto, in many of the compound semiconductors which are the direct-transition semiconductors, the minimum energy point is positioned at the Γ point both in the conduction band and in the valence band. As a result, the momentum conservation law and the energy conservation law can be satisfied simultaneously. Consequently, the light-emission efficiency is high in the compound semiconductors.

In R. Chan, M. Feng, N. Holonyak, Jr., A. James, and G. Walter, Appl. Phys. Lett. Vol. 88, pp. 143508-1 to 143508-3 (2006), a transistor-laser device has been reported. In this transistor-laser device, a laser using compound semiconductor with high light-emission efficiency is driven by a bipolar transistor formed of compound semiconductor.

As described above, silicon in the bulk state exhibits an extremely bad light-emission efficiency. It has been known, however, that forming silicon into a porous state or nano-particle state allows an enhancement in the light-emission efficiency.

In, e.g., L. T. Canham, Appl. Phys. Lett. Vol. 57, pp. 1046 to 1048 (1990), the following report has been given: Forming silicon, whose anode is oxidized in hydrofluoric-acid solution, into a porous state allows the silicon to emit light at room temperature and in visible-light wavelength zone. It is conceivable that, although its mechanism has been not yet clarified completely, quantum size effect would be important which arises due to existence of the silicon confined into a narrow region by formation of the porous. Inside the silicon in the small size, position of an electron is confined within the narrow region. As a result, conversely, momentum of the electron ceases to be determined based on Uncertainty Principle of quantum mechanics. For this reason, it is conceivable that recombination of the electron and the hole would become more likely to occur.

As another method for the light emission using silicon, in, e.g., S. Coffa, G. Franzo, and F. Priolo, Appl. Phys. Lett. Vol. 69, pp. 2077 to 2079 (1996), the following description has been given: Injecting Er ions into a p-n junction formed on Si substrate permits fabrication of a light-emitting diode which becomes the light-emitting device. It is conceivable that the mechanism for the light emission is as follows: Injecting the Er ions into the Si substrate prompts the Er ions to form an impurity level. The impurity level is a level that is localized in space. Accordingly, if an electron existing in the conduction band of Si is captured into the impurity level formed by the Er ions, momentum of the electron becomes equal to effectively zero. As a result, the electron finds it possible to recombine with the hole in the valence band, thereby emitting the light. Since the light emitted with an intervention of the Er ions is 1.54-μm-wavelength light, the light can be propagated without being absorbed into the surrounding silicon. Also, the 1.54-μm wavelength is a wavelength that results in a less loss when the already-existing optical fibers are used. Accordingly, even if technological innovations in the future successfully make the Er-ion-doped Si-based LEDs commercially available, the already-existing fiber-optic networks can be used. Consequently, it is now expected that there would be no need of making large-scale investment in facilities.

Moreover, as still another method for the light emission using silicon, in, e.g., F. Iacona, G. Franzo, E. C. Moreira, and F. Priolo, J. Appl. Phys. Vol. 89, pp. 8354 to 8356 (2001), and S. Coffa, IEEE Spectrum, October, pp. 44 to 49 (2005), the following description has been given: The above-described quantum size effect and the above-described idea of the Er ions are combined with each other. Namely, injecting the Er ions into the silicon's nano particles has allowed implementation of the light emission with an enhanced light-emission efficiency.

As described earlier, the long-distance information communications are currently performed based on the optical communications. The compound semiconductors, however, are used as optical devices for the optical communications. A laser formed of a compound semiconductor exhibits an exceedingly good light-emission efficiency. The laser formed of a compound semiconductor, however, is accompanied by the following problems: The material is the costly and expensive one, and implementation of the integration has been not developed. The latter problem arises from the fact that the material is composed of a plurality of elements, and thus the control is difficult. This is, e.g., the following problem: Assume that, when a single laser or light-receiving device is fabricated using a compound semiconductor, the yield has been found to be 70%. If, however, the two lasers or light-receiving devices are merely combined, the corresponding yield lowers, thus becoming equal to 50%. The word of Opto-Electronic IC (abbreviated as OEIC) itself does exist. In the case of the compound-semiconductor-used optical devices, however, implementation of the OEIC is difficult from the realistic point-of-view.

On the other hand, in the case of the silicon-used LSIs, in the case of products to which the most up-to-date fine miniaturization has been applied, 100 million or more metal-insulator-semiconductor field-effect transistors have been already integrated, thus being mass-produced as each product. Namely, in the case of the silicon-used devices, a plurality of devices can be fabricated with the yield which is substantially close to 100%. This is because high-quality mono-crystal silicon substrates are easily available. Accordingly, even if a large number of devices are integrated on the same chip, it has become possible to raise the yield as the chip up to a level which is economically realistic as well. Consequently, there exists a problem that it is desired to implement a high-efficiency light-emitting device based on a IV semiconductor such as silicon or germanium comparable thereto.

In the conventional technologies, it has been considered that, in order to cause silicon to emit light, the band structure of the conduction band of silicon needs to be altered from the band structure of silicon in its bulk state. Namely, in order to keep the momentum away from the point of $k_0$ by using Uncertainty Principle, silicon is formed into a porous state or nano-particle state, thereby allowing the quantum size effect to occur. However, the formation of silicon of the structure such as, e.g., the nano particles results in a feature that the silicon surface is extremely likely to be oxidized. Accordingly, there exists a problem that the surface of the nano-particle silicon is oxidized to form silicon dioxide on the surface. Since silicon dioxide is an insulating material whose bandgap is tremendously large, there occurs a problem that the formation of silicon dioxide on the surface prevents electrons and holes from being effectively injected. Consequently, in the conventional silicon light-emitting devices, there occurs a problem that the light-emission efficiency is extremely lowered in electroluminescence even if high light-emission intensity can be obtained in photoluminescence. Also, at the time of the light emission, the crystalline property of a matter which becomes the light-emitting layer turns out to be important. However, there exists a problem that, in the nano particles formed by Chemical Vapor Deposition method or the structure that a large number of irregular holes are bored on the surface by anode oxidation, the crystalline property becomes worse as compared with the mono crystal. The bad crystalline property gives rise to a situation that there occurs light emission with the intervention of a defect level. The light emission using a defect is accompanied by a bad light-emission efficiency. Accordingly, there exists a problem that it is impossible to manufacture a device which is practical and usable enough for the information communications and the like.

As described above, efforts are now under way to permit silicon to emit light by using the various techniques such as porous silicon, silicon's nano particles, and Er doping. There exists a problem, however, that the light-emission efficiency has not attained to the practical level yet.

Also, in the conventional silicon light-emitting devices, silicon is formed into the porous state, or the silicon's nano particles are used. Consequently, there exists a problem that it is difficult to implement high-density integration of the devices in a manner compatible with the ordinary CMOS (Complementary Metal-Oxide-Semiconductor) technologies. In order to integrate the silicon light-emitting devices on the same chip on which the LSIs, i.e., conventional electronic devices, are integrated, there exists a problem that it is desired to fabricate the silicon light-emitting devices by using a process which matches the conventional silicon process.

Also, in order to perform inter-chip or in-chip information communications using light-emitting devices on a silicon substrate, it is required to employ not mere LEDs but light-emitting devices having strong directivity and monochromatic property. Accordingly, there exists a problem that it is desired to implement laser diodes by implementing laser oscillation.

SUMMARY OF THE INVENTION

In view of the above-described conventional problems, the present invention has been devised. Accordingly, it is an object of the present invention to provide a high-efficiency light-emitting device whose basic configuration element is a IV semiconductor such as silicon or germanium comparable thereto, and a fabrication method of fabricating the high-efficiency light-emitting device on a substrate such as silicon. Here, the above-described fabrication method is based on a method which allows the light-emitting device to be easily fabricated by using the ordinary silicon process.

Also, it is another object of the present invention to provide a light-emitting field-effect transistor whose basic configuration element is a IV semiconductor, and whose light-emission intensity or light-emission wavelength is controllable with the gate voltage, and a fabrication method of fabricating the light-emitting field-effect transistor.

Also, it is still another object of the present invention to provide a device based on a IV semiconductor which is capable of performing laser oscillation, and a fabrication method of fabricating the device.

Of inventions to be disclosed in the present invention, the outline of the representative invention will be briefly explained as follows:

A light-emitting device according to the present invention includes a first electrode unit for injecting an electron, a second electrode unit for injecting a hole, and light-emitting units electrically connected to the first electrode unit and the second electrode unit respectively, wherein the light-emitting units are formed of mono-crystal silicon, the light-emitting units having a first surface (topside surface) and a second surface (underside surface) opposed to the first surface, plane orientation of the first and second surfaces being set to a (100) plane, thicknesses of the light-emitting units in a direction orthogonal to the first and second surfaces being made extremely thin.

Of inventions to be disclosed in the present invention, the effect obtained by the representative invention will be briefly explained as follows:

According to the present invention, it becomes possible to provide a light-emitting device which can be easily fabricated on a substrate such as silicon by using the ordinary silicon process, and which can emit light with a high efficiency.

Other objects, features and advantages of the invention will become apparent from the following description of the embodiments of the invention taken in conjunction with the accompanying drawings.

DESCRIPTION OF THE INVENTION

Figure 1A:
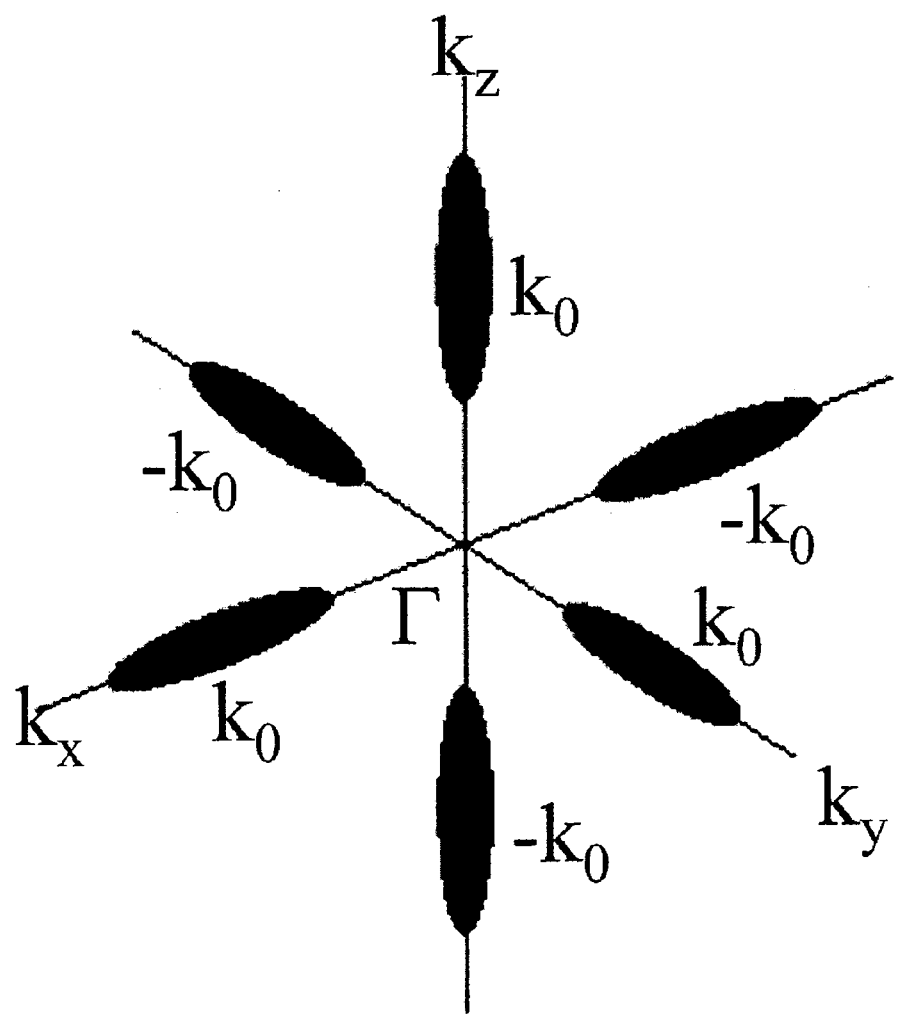
FIG. 1A is the band structure of silicon in bulk state, which is used for explaining the principle of the present invention.

Hereinafter, based on the drawings, the detailed explanation will be given below concerning an embodiment of the present invention. Incidentally, in all of the drawings for explaining the embodiment, the same reference numeral is affixed to components having the same function, and the repeated explanation thereof will be omitted. Also, it is needless to say that many modifications, such as changing combination of material and fabrication steps, are executable in addition to a method to be introduced in the present embodiment.

First, the explanation will be given below concerning the principle for causing a IV semiconductor, such as silicon or germanium comparable thereto, to emit light with a high efficiency. This principle becomes the basis for the present invention.

The wave function ψ(r), which indicates the state of an electron inside a crystal such as silicon, can be written as (Expression 1) with a very good approximation.

$$\psi(r) = \phi_{k_0}(r)\xi(r) \quad \text{[Expression 1]}$$

Here, $k_0$ denotes the momentum at which band's valley of the conduction band is positioned, r=(x, y, z) denotes the position in space, $\phi_{k0}$ (r) denotes a Bloch function at the band's valley of the conduction band, and ξ(r) denotes an envelop function. The Bloch function $\phi_{k0}$ (r) can be written as (Expression 2) by using a periodic function $u_{k0}$ (r), which reflects periodicity for a unit lattice vector a inside the crystal (: $u_{k0}$(r+a)=$u_{k0}$(r)).

$$\phi_{k_0}(r) = u_{k_0}(r) e^{-i k_0 \cdot r} \quad \text{[Expression 2]}$$

As is apparent from (Expression 2) as well, the Bloch function $\phi_{k0}$ (r) oscillates violently as a function of distance on an atomic scale. In contrast thereto, the envelop function ξ(r) indicates a component which varies moderately on the atomic scale. Concretely, the envelop function ξ(r) indicates a physical geometry of the semiconductor, or its response to an external field applied thereto from the surroundings. Here, consideration is given to ψ(r) including a case as well where ψ(r) is the wave function inside a semiconductor structure which has a finite size but is not necessarily a bulk crystal. As a result of this consideration, an expression that the envelop function ξ(r) should satisfy can be derived as (Expression 3).

$$[\epsilon(k_0 - i\nabla) + V(r)]\xi(r) = E\xi(r) \quad \text{[Expression 3]}$$

Here, ϵ=ϵ(k) indicates the band structure in the bulk of a conduction-band electron having momentum k. The result obtained by substituting summation of a differential operator −i∇ and the momentum $k_0$ into the momentum k is represented as ϵ($k_0$−i∇). Also, V=V (r) is a potential that the electron feels. For example, this potential presents a potential barrier when an insulator or a different type of semiconductor is in contact with boundary portion of the present semiconductor. Also, the value of V=V (r) can be adjusted by applying an electric field to the electron on the basis of the electric-field effect from the outside. Here, for simplicity, attention is focused on a change in V in the z direction alone.

Here, for easy-to-understand explanation, let's assume, concretely, e.g., silicon on a (100) plane as the present semiconductor. In its bulk state as described above, the silicon has the band structure as was illustrated in FIG. 1A. Consequently, the valley of the conduction band existing at (0, 0, ±$k_0$) in the $k_z$ direction can be approximated as (Expression 4).

$$\varepsilon(k) = \frac{\hbar^2}{2m_t^*}(k_x^2 + k_y^2) + \frac{\hbar^2}{2m_l^*}(k_z \mp k_0)^2 \quad \text{[Expression 4]}$$

Here, m*$_t$ and m*$_l$ denote the effective mass inside the silicon crystal determined from curvatures in the minor-axis and major-axis directions of the valley of the conduction band whose geometry is spheroidal. Then, (Expression 3) can be rewritten as (Expression 5).

$$\left[-\frac{\hbar^2}{2m_t^*}(\partial_x^2 + \partial_y^2) - \frac{\hbar^2}{2m_l^*}\partial_z^2 + V(r)\right]\xi(r) = E\xi(r) \quad \text{[Expression 5]}$$

Then, letting the direction parallel to the (100) plane be (x, y), and denoting the width and length by W and L respectively, (Expression 5) becomes (Expression 7) by setting the envelop function ξ(r) as (Expression 6).

$$\xi(r) = \frac{e^{i(k_x x + k_y y)}}{\sqrt{LW}} \chi(z) \quad \text{[Expression 6]}$$

$$\left[-\frac{\hbar^2}{2m_l^*}\partial_z^2 + V(z)\right]\chi(z) = \Delta E \chi(z) \quad \text{[Expression 7]}$$

Here, ΔE denotes the energy in the z direction. The total energy of the electron measured from the bottom of the conduction band is represented as (Expression 8).

$$E = \frac{\hbar^2 k_x^2}{2m_t^*} + \frac{\hbar^2 k_y^2}{2m_t^*} + \Delta E \quad \text{[Expression 8]}$$

First, it is confirmed that (Expression 7) will be able to reproduce the electron state in the bulk. For this confirmation to be made, it is preferable to determine the solution in a continuous state at the time of setting V (r)=0. Then, letting the thickness of the semiconductor in the z direction be t, the envelop wave function and ΔE turn out to become (Expression 9) and (Expression 10), respectively. This confirms the above-described reproduction.

$$\chi(z) = \frac{1}{\sqrt{t}} e^{i k_z z} \quad \text{[Expression 9]}$$

$$\Delta E = \frac{\hbar^2 (k_z \mp k_0)^2}{2m_l^*} \quad \text{[Expression 10]}$$

Namely, the wave function oscillates violently in the state where the wave function expands continuously over the entire bulk crystal. At this time, quantum-mechanical expectation value of the momentum in the z direction, as a matter of course, is given by (Expression 11) when letting the momentum operator in the z direction be $k_z$.

$$\langle \hat{k}_z \rangle = \int d^3 r \psi^*(r)(-i\partial_z)\psi(r) \quad \text{[Expression 11]}$$
$$= k_z \pm k_0$$

Namely, (Expression 11) shows the following fact in terms of mathematical expression as well: In the indirect-transition semiconductors such as silicon, many of the electrons are moving around with the exceedingly large amount of momentums held thereon. This is because the probability that the electrons exist at points distant away from the Γ point in the momentum space is an overwhelmingly high probability.

The present invention takes advantage of the following fact as its fundamental principle: Namely, in the case of an extremely-thin semiconductor film, i.e., the thickness t of the semiconductor film in the z direction is exceedingly thin, on account of the quantum confinement effect, the semiconductor, which is an indirect-transition semiconductor in its bulk state, changes effectively to a direct-transition semiconductor. Hereinafter, the detailed explanation will be given below regarding this point.

For concrete and easy-to-understand explanation of the story, subsequently, take silicon as the example, and the following assumption is made: The thickness t of the silicon film in the z direction is exceedingly thin, and, on the topside and underside in the z direction, the silicon film is in contact with an insulator with a large bandgap such as $SiO_2$, or vacuum or atmosphere with a large potential energy barrier. Basically the same effect can be expected by, e.g., confining the electrons into a narrow region on the basis of the electric-field effect. In these cases, the wave function of an electron inside the silicon becomes equal to zero at the topside and underside boundary interfaces in the z direction. Strictly speaking, quantum-mechanical leakage of the wave function exists, of course. Nevertheless, the approximation that the wave function becomes equal to zero at the boundary interfaces is substantially strictly right. This is because the energy barrier is large, and thus the leakage becomes exponentially smaller and smaller with respect to the distance in the z direction. Then, even if the value of the potential V (r) applied from the outside is V (r)=0, the manner of the envelop wave function is found to be completely different from the one in the case where t is thick. In fact, letting index for indicating discrete energy levels be n, the envelop wave function of an electron and a hole confined inside the quantum well like this can be solved as (Expression 12) when n=0, 2, 4, . . . , i.e., an even number, and as (Expression 13) when n=1, 3, 5, . . . , i.e., an odd number. The value of the energy levels can be represented as (Expression 14) regardless of whether n is an even number or odd number.

$$\chi_n(z) = \sqrt{\frac{2}{t}} \cos\left(\pi \frac{z}{t}(n+1)\right) \quad \text{[Expression 12]}$$

$$\chi_n(z) = \sqrt{\frac{2}{t}} \sin\left(\pi \frac{z}{t}(n+1)\right) \quad \text{[Expression 13]}$$

$$\Delta E = \frac{\hbar^2}{2m_t^*} \frac{\pi^2}{t^2}(n+1)^2 \quad \text{[Expression 14]}$$

Needless to say, the state at the lowest energy level is n=0. It has been assumed that, when the envelop wave functions are written down, origin point of the z axis is set up at the center of the thin-film silicon, and that the boundary interfaces with the high energy barrier exist at z=±t/2. Here, the explanation will be given below concerning property of the envelop wave function $\chi_n(z)$. When n=0 or an even number, the wave function is symmetrical with respect to a sign change in z, and thus the wave function has a property of $\chi_n(z)=\chi_n(-z)$. This property is expressed as "parity is even". Meanwhile, When n=an odd number, the wave function has a property of $\chi_n(z)=-\chi_n(-z)$, which is expressed as "parity is odd". The envelop wave function has the structure on which the symmetry like this is reflected. As a result, evaluating a contribution made to the momentum by the envelop wave function results in (Expression 15).

$$\langle \chi_n | \hat{k}_z | \chi_n \rangle = \int dz \chi_n^*(z)(-i\partial_z)\chi_n(z) \quad \text{[Expression 15]}$$
$$= 0$$

This expression shows the following extremely general property: Performing differentiation of $\chi_n(z)$ with respect to the z direction changes the parity which $\chi_n(z)$ has had originally. As a result, performing the integration with respect to the z direction results in zero. Namely, we learn that there exists a property that, since the electron is strongly bound in the z direction, the envelop wave function becomes a standing wave, and thus the electron ceases to move. This situation is completely in contrast to the situation in the bulk state that the envelop wave function in the bulk state is the exponential function as was given by (Expression 9), and thus the electron is moving around over the entire bulk crystal with the momentum held thereon. Attention, however, should be paid to the fact that the quantum-mechanical expectation value of the momentum in the z direction becomes equal to (Expression 16). This is because the total wave function, where existence of the Bloch function is also taken into consideration, is obtained by substituting (Expression 2) and (Expression 6) and (Expression 13) or (Expression 14) into (Expression 1).

$$\langle \hat{k}_z \rangle = \int d^3 r \psi^*(r)(-i\partial_z)\psi(r) \quad \text{[Expression 16]}$$
$$= \pm k_0$$

Namely, as the inherent property of the semiconductor material, in the bulk state, the valley of the conduction band exists not at the $\Gamma$ point, but at $(0, 0, \pm k_0)$. As a result, the wave function as a whole reflects this inherent property. Considering the situation in this way, in the case of the thin-film silicon as well, the electron seems to be moving around with the momentum $\pm k_0$ held thereon. We have noticed, however, that attention should be paid to this physical picture. That is to say, in a matter such as, e.g., silicon which has the inversion symmetry as crystal, attention should be paid to the fact that the valley of $(0, 0, +k_0)$ and the valley of $(0, 0, -k_0)$ are equal in energy, i.e., they are degenerated. In this way, when quantum-mechanical states having an extremely generally degenerated energy level are confined into the same region in space, hybridization takes place between these states. Namely, if only there exists only an exceedingly slight amount of energy coupling which couples between the valley of $(0, 0, +k_0)$ and the valley of $(0, 0, -k_0)$, the two discrete energy levels form a bonding orbital and an antibonding orbital. For example, it is conceivable that the Coulomb interaction exerted between electrons, which is not included into the band calculation sufficiently, will be strongly exerted between electrons that are confined within a narrow region. The Coulomb interaction exerted between electrons, which is referred to as electron correlation, has become the big problems in many of the transition metal oxides, the most important of which is the high-temperature superconductivity. In silicon in the bulk state, however, the electron correlation has not become the major problem so far. This is due to reflection of the fact that an sp orbital in the original silicon atom has the large orbital. If, however, electrons are confined into an extremely narrow region in which the quantum-mechanical effect becomes important, the Coulomb interaction will be strongly exerted between the electrons. Consequently, it becomes impossible to neglect the Coulomb interaction exerted between the electrons. Calculating matrix elements of the Hamiltonian into which the Coulomb interaction is correctly taken gives rise to the hybridization which couples between the valley of $(0, 0, +k_0)$ and the valley of $(0, 0, -k_0)$. Moreover, diagonalizing the Hamiltonian shows that the coupling is split into a bonding orbital and an antibonding orbital. This resembles the process in which a hydrogen molecule is going to be formed as two hydrogen atoms are made to come nearer and nearer. The method for evaluating such a system had been already understood by Heitler-London about seventy years ago when quantum mechanics was established. We have noticed for the first time that, when a IV semiconductor such as silicon is confined into a narrow region, the formation of the bonding state already understood by Heitler-London becomes important in the coupling of the valleys as well. Also, even if there exists none of such a coupling in energy terms, a standing wave that does not move in the z direction can be constructed from a unitary transformation of the two states. This will be explained below a little more concretely. The Bloch function $\phi_{k0}(r)$ has a property of $u_{-k0}(r) = u_{k0}(r)$ from the inversion symmetry that the crystal has. Accordingly, the Bloch function in the valley of $(0, 0, +k_0)$ and the one in the valley of $(0, 0, -k_0)$ can be written as $\phi_{k0}(r) = u_{k0}(r) e^{ik0z}$ and $\phi_{-k0}(r) = u_{k0}(r) e^{-ik0z}$, respectively. Then, we knows that attention should be focused on the portion of $e^{\pm ik0z}$ alone. In order to construct new basis states from the summation and subtraction of these wave functions, $e^{\pm ik0z}$ are transformed into (Expression 17) by applying a unitary transformation U thereto.

$$U\begin{pmatrix} e^{ik_0 z} \\ e^{-ik_0 z} \end{pmatrix} = \frac{1}{\sqrt{2}} \begin{pmatrix} 1 & 1 \\ -i & i \end{pmatrix} \begin{pmatrix} e^{ik_0 z} \\ e^{-ik_0 z} \end{pmatrix}$$
$$= \sqrt{2} \begin{pmatrix} \cos(k_0 z) \\ \sin(k_0 z) \end{pmatrix}$$
[Expression 17]

Then, we learn that the change in the wave function on an atomic scale can be described by two standing-wave wave functions of $2^{1/2} u_{k0}(r) \cos(k_0 z)$ and $2^{1/2} u_{k0}(r) \sin(k_0 z)$. Moreover, the total wave function can be represented as (Expression 18) and (Expression 19).

$$\psi(r) = \sqrt{2} u_{k_0}(r) \cos(k_0 z) \xi(z)$$ [Expression 18]

$$\psi(r) = \sqrt{2} u_{k_0}(r) \sin(k_0 z) \xi(z)$$ [Expression 19]

The quantum-mechanical expectation value of the momentum in the z direction in the state of (Expression 18) or (Expression 19) becomes equal to (Expression 20). This result reflects the condition that the two wave functions are the standing waves.

$$\langle \hat{k}_z \rangle = \int dz \psi^*(z)(-i\partial_z)\psi(z)$$
$$= \pm k_0$$
[Expression 20]

Namely, we learn that the electron does not move at all in the z direction. Merely changing the basis states makes the expectation value of the momentum seem to have changed. Since this is rather likely to cause misunderstanding, a comment is made here. Actually, the basis wave functions such as (Expression 18) and (Expression 19) are not eigenstates of the momentum. Namely, the use of (Expression 18) and (Expression 19) makes matrix elements of the momentum operator become equal to (Expression 21). In (Expression 21), the diagonal matrix elements become equal to zero, and the non-diagonal matrix elements become equal to purely imaginary numbers.

$$U\begin{pmatrix} k_0 & 0 \\ 0 & -k_0 \end{pmatrix} U^{-1} = \begin{pmatrix} 0 & ik_0 \\ -ik_0 & 0 \end{pmatrix}$$ [Expression 21]

It depends on the property of a system employed as the target whether the selection of the basis wave functions like this is physically suitable or not. Although we have assumed the extremely-thin mono-crystal silicon film, the translation symmetry with respect to the z direction is going to collapse in such a system. Consequently, it is suitable to use $2^{1/2} u_{k0}(r) \cos(k_0 z)$ and $2^{1/2} u_{k0}(r) \sin(k_0 z)$, which have become the standing waves, rather than to use $u_{k0}(r) e^{\pm ik0z}$, which are the eigenstates of the momentum. Conversely, when dealing with the bulk state, it is suitable to use $u_{k0}(r) e^{\pm ik0z}$, because the translation symmetry exists. Also, in the bulk state, the electron having the momentum $\pm k_0$ is violently moving around inside the crystal. At this time, the electron is strongly scattered by particles such as a phonon, i.e., quantum of lattice vibration inside the crystal. As a result, phases of the wave functions vary dynamically. Accordingly, it cannot be expected to form a state where the state with momentum $+k_0$ and the state with momentum $-k_0$ are coherently coupled. In contrast thereto, when, just like the extremely-thin mono-crystal silicon film, the electron is confined into an extremely narrow region (which may be thinner than the mean free path, i.e., a length characteristic of the scattering), the wave functions find it easy enough to form standing waves with definite phases at room temperature. This, qualitatively, means that, while going back and forth within the narrow region at a high speed, the electron waves become stationary waves which exactly match the size of the region.

As having been explained in detail using the simple mathematical expressions, the following fact has been made clear: Namely, when an electron is confined into an extremely narrow region, representative of which is the extremely-thin mono-crystal silicon film, even in a substance such as silicon where an electron in the conduction band does not exist at the Γ point in the bulk's electronic state, the electron will not move effectively in the direction orthogonal to the extremely-thin silicon film. This, qualitatively, indicates quite a natural thing that the electron finds it impossible to move in the direction orthogonal to the extremely-thin film because the direction orthogonal to the extremely-thin film disappears. Namely, this means that, even if the electron is moving at a high speed inside the crystal in the bulk state, in the extremely-thin film, the electron cannot help stopping because the very direction in which the electron should move disappears.

Figure 1B:
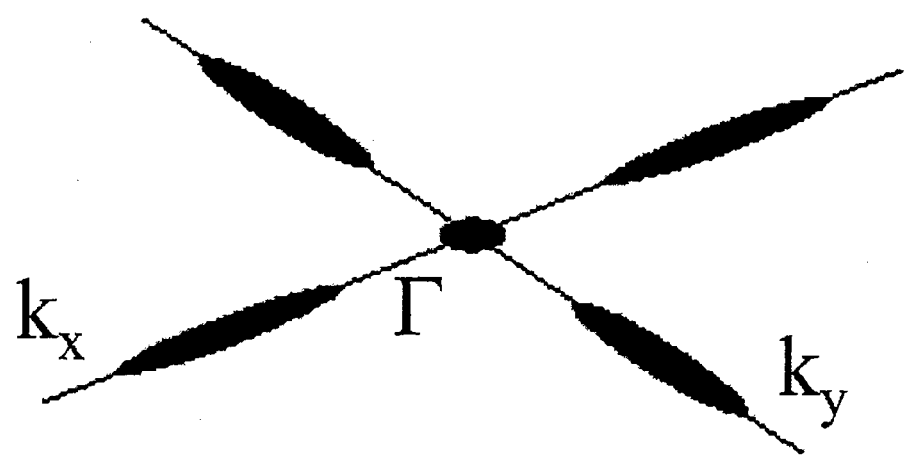
FIG. 1B is the band structure of silicon in thin film state or gate-voltage applied state, which is used for explaining the principle of the present invention.

FIG. 1B explains this manner by using the band diagram. Since the electron finds it impossible to move in the z direction, FIG. 1A, i.e., the band structure in the bulk state, is projected on the plane of $k_z=0$. Namely, when the thin film or the electric-field effect is applied, the band structure in the bulk state is transitioned to the band structure as is illustrated in FIG. 1B. The band structure as is illustrated in FIG. 1B, which is the basics in designing a field-effect transistor using silicon, can be safely said to be the basics of Device Physics without exaggeration. A system confined into a two-dimensional world in this way is referred to as a two-dimensional electronic system. Forming silicon not into the thin-film structure but into a narrow-wire structure makes it possible to form a one-dimensional electronic system where the dimension is further lowered.

Assuming as a precondition the band structure as illustrated in FIG. 1B, as described above, we learn that the state corresponding to the valley $(0, 0, \pm k_0)$ in FIG. 1A in the bulk state is transitioned to the Γ point in FIG. 1B. As described above, the electron existing in this state does not move in the z direction.

Getting back to the basics of Device Physics like this in devising the present invention, we have attained to a concept that the electron existing at the Γ point in FIG. 1B should recombine with a hole with a high efficiency, and should be able to be used as a light-emitting device. Namely, confining the electron into a narrow region prevents the electron from moving freely. As a result, when the electron collides with the hole which has a small momentum since it exists at the Γ point similarly, the electron can emit light which also has a small momentum without breaking the momentum conservation law and the energy conservation law. As described earlier, the momentum is a scale of quantifying with about how much impulse a particle will scatter another particle when the particle collides with it. We have noticed that the momentum of the electron is lost when the electron is prevented from moving by being confined into a narrow region. The implementation of the electron's small momentum makes it possible to satisfy the momentum conservation law at the time of a scattering, which was difficult to satisfy by the conventional methods. Consequently, even a IV semiconductor such as silicon comes to emit light with a high efficiency.

Figure 2:
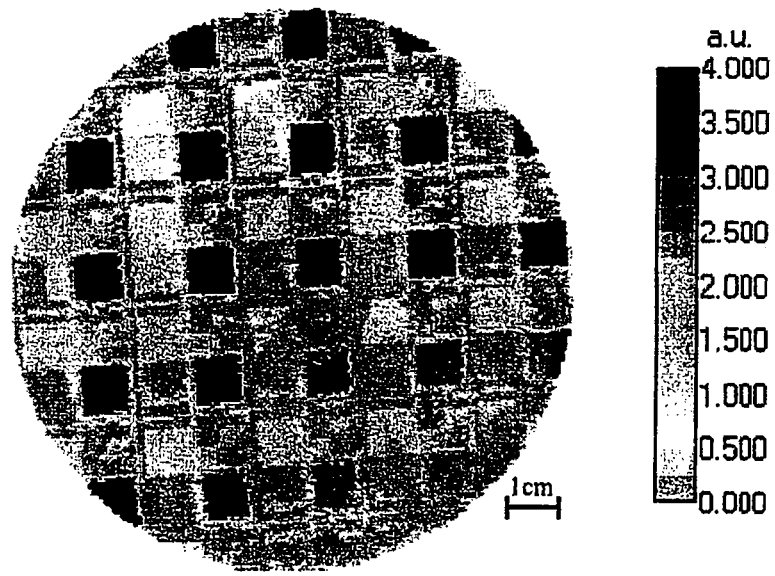
FIG. 2 is experimental data for demonstrating the principle of the present invention, i.e., light-emission intensity from an extremely-thin silicon layer.
Figure 3:
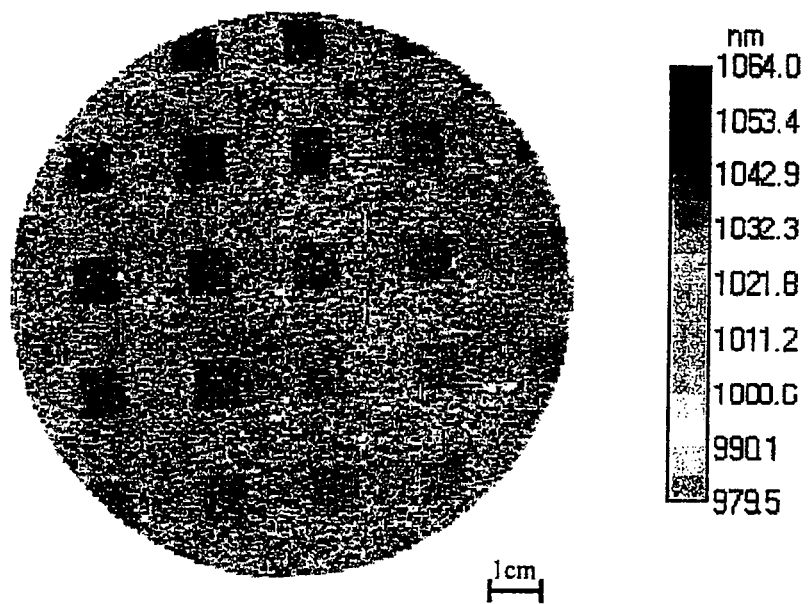
FIG. 3 is experimental data for demonstrating the principle of the present invention, i.e., light-emission wavelength from the extremely-thin silicon layer.
Figure 4A:
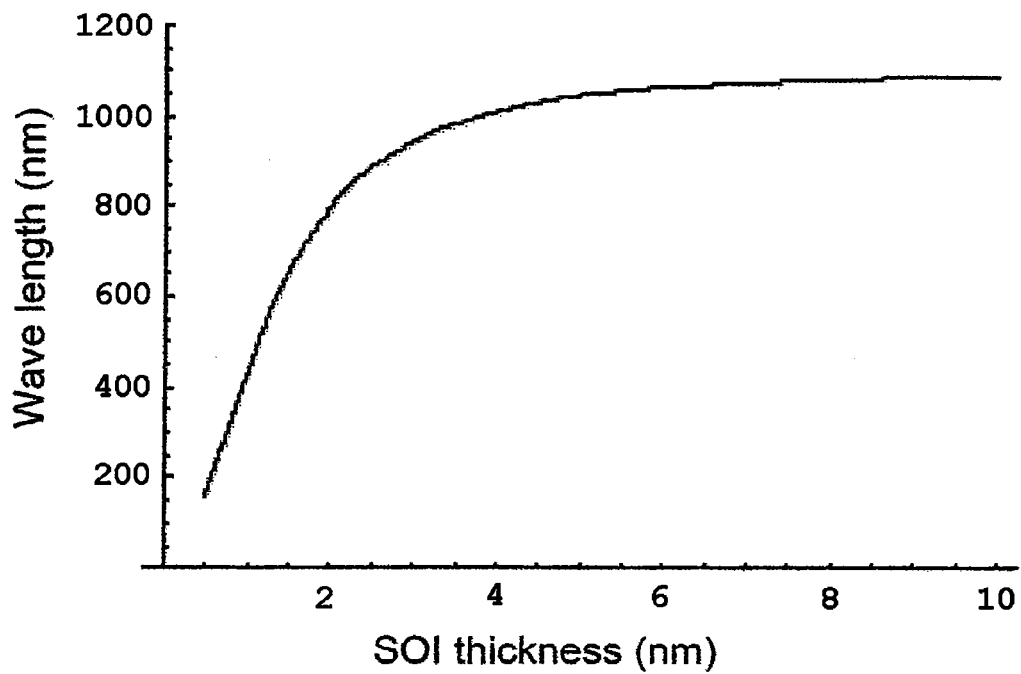
FIG. 4A is the light-emission wavelength's dependence on film thickness of the extremely-thin silicon layer based on the principle of the present invention.
Figure 4B:
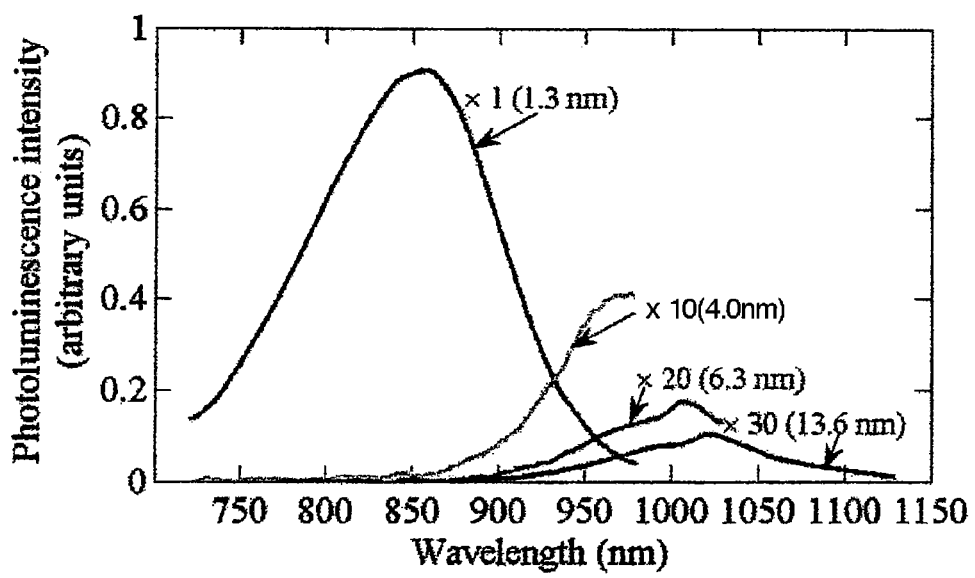
FIG. 4B is the light-emission wavelength/intensity's dependence on the film thickness of the extremely-thin silicon layer based on the principle of the present invention.

FIG. 2, FIG. 3, and FIG. 4B illustrate results which, based on the concept like this, are obtained by actually forming 1-centimeter per-side extremely-thin Si films on a substrate partially, and measuring the photoluminescence. FIG. 2 and FIG. 4B illustrate intensity of the light-emission given by the photoluminescence. These show that the extraordinarily strong light-emission intensity has been observed from the extremely-thin Si films. This intensity is stronger by the amount of a few digits as compared with the light-emission given by the indirect transition of silicon in its bulk state. Namely, it is conceivable that confining the electron into the narrow region permits a IV semiconductor such as silicon to change effectively to a direct-transition semiconductor. Also, FIG. 3 illustrates peak wavelength of the spectrum obtained at the time of the experiment. This has made it possible to confirm that the wavelength larger than the bandgap of silicon by the amount of the energy indicated by (Expression 14) has been obtained. This reflects the fact that the bandgap has become larger by the amount by which the energy becomes discrete because of the quantum confinement effect, which shows that the above-described principle is correct. FIG. 4A illustrates a result obtained by calculating about to what extent the light-emission wavelength will change as a result of the bandgap which has become larger.

Also, in the present invention, the injection method of injecting electrons and holes has also been devised. In the light-emission from the conventional porous silicon and silicon's nano particles, the silicon-dioxide insulating film exists between the adjacent silicon's nano particles and silicon's narrow wires which become the light-emission center. The existence of this silicon-dioxide insulating film has prevented the electrons and the holes from being effectively injected. In the present invention, however, the single mono-crystal silicon film is employed, then being directly connected to the electrode. This configuration eliminates the possibility that the silicon-dioxide insulating film will suppress the injection of the carriers, thereby making it possible to cause silicon to emit light electrically with a high efficiency.

Also, in the present invention, in a manufacturing method for the extremely-thin silicon film, taking advantage of the oxidization process has allowed a good-controllability and uniform silicon film to be formed on a substrate. The oxidization process in the silicon process is the highest-controllability manufacturing process. Accordingly, the use of this process has successfully allowed the formation of the uniform extremely-thin silicon film. This manufacturing method is completely the opposite to the formation method of forming the conventional silicon light-emitting devices. Namely, conventionally, using the CVD method or the like, the silicon's nano particles are made bigger little by little from the atomic level, thereby being controlled up to a few-nm scale. In the present invention, however, the device manufacturing steps start from a substrate on which mono-crystal silicon such as SOI (Silicon On Insulator) having good crystalline property from the beginning has been already formed, and the mono-crystal silicon is made thinner up to the limit with a good controllability. Also, in the conventional formation of the silicon's nano particles using the CVD method, plane orientations of the crystal could not be aligned uniformly. This means that the silicon's nano particles are formed naturally in a self-organized manner, and thus are extremely difficult to control. In contrast thereto, in the light-emitting device according to the extremely-thin silicon film based on the present invention, the plane orientations on the surfaces can be completely specified with an exceedingly good controllability. This is because the mono-crystal silicon substrate having the aligned plane orientations from the beginning is used. As having been exactly explained earlier, the plane orientations should be designed so that the momentum becomes equal to zero at the minimum energy points in the conduction band and the valence band.

As described above, in order to cause silicon to emit light with a high efficiency, the valley in the energy is effectively transitioned to the Γ point. This is made possible by setting a (100) plane as the surface, and making the silicon's film thickness extremely thin. Being not only to silicon, the high-efficiency light-emitting device according to the present invention is similarly applicable to another semiconductor such as germanium. In the case of germanium, in the bulk state, the valley in the energy of the conduction band exists at the L point. Accordingly, a thin film whose surface is a (111) plane is formed. This allows the minimum energy point in the thin film to be positioned at the Γ point, thereby making it possible to cause germanium to emit light with a high efficiency. For implementing such a thin film, e.g., a substrate such as SOI (Silicon On Insulator), on the surface of which the silicon (111) plane is exposed, is prepared. Next, germanium is epitaxially grown on the substrate. After that, the film thickness is made thin by oxidization or the like, thereby forming the extremely-thin germanium film whose surface is the (111) plane. Also, taking advantage of silicon-germanium, i.e., mixed crystal of silicon and germanium, results in implementation of a bandgap between silicon and germanium. This also makes it possible to adjust the light-emission wavelength further.

As the method for confining the carriers into a narrow region with a high efficiency, in addition to the processing of a IV semiconductor into the extremely-thin film as described above, several methods exist. First, as the processing methods, in addition to the above-described oxidization process, the following methods are conceivable: A method of etching the semiconductor by wet etching process or dry etching process, a method of forming layer of desire film thickness by epitaxial growth, a method of forming pseudo mono-crystal film by SELAX (Selectively Enlarging Laser X'tallization) technology, and the like. It is needless to say that the extremely-thin mono-crystal film may be formed using any of the above-described manufacturing methods. Also, in substitution for making the film thickness extremely thin just like the extremely-thin silicon film, the carriers may also be confined by forming inversion layer or accumulation layer by applying gate voltage thereto.

As described above, although the silicon-used electronics has already reached its limit, we have noticed that the use of the high-efficiency light-emitting device according to the present invention brings about a possibility of being capable of breaking through the limit. Namely, conventionally, information was processed by exchanging elementary particles having electric charges, such as electrons and holes. In this method, however, velocities of the particles are overwhelmingly slower than velocity of light, and thus there existed a limit in the information processing speed. Then, in order to break through the limit, we have attained to a concept that it is effective to process the information directly with the use of light. For a structure therefor, in the present invention, we have devised a light-emitting field-effect transistor. In this light-emitting field-effect transistor, injection amount of electrons and holes is controlled by the electric-field effect, thereby allowing modulation of the light-emission intensity. In addition, since the binding energy generated by the quantum confinement effect can be controlled by applying the gate voltage, it also becomes possible to change the light-emission wavelength.

Next, the explanation will be given below concerning embodiments based on the above-described principle of the present invention.

Embodiment 1

In the present embodiment, the disclosure will be made below concerning a high-efficiency light-emitting device and a fabrication method of fabricating the high-efficiency light-emitting device. Here, the above-described light-emitting device is formed on a Silicon-On-Insulator (SOI) substrate by a method which allows the light-emitting device to be easily formed by using the ordinary silicon process.

Figure 5A:
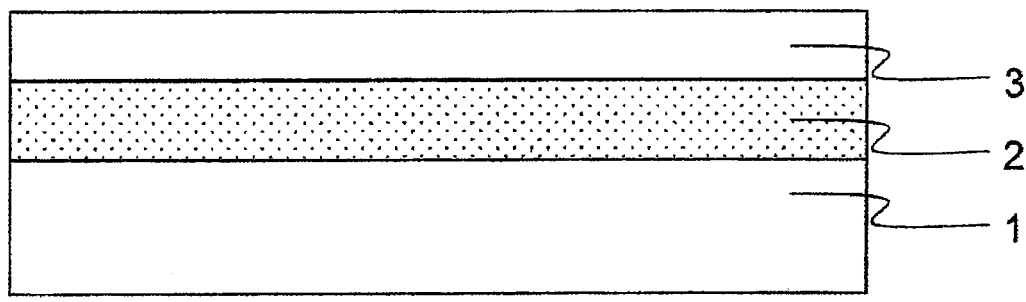
FIG. 5A is a cross-sectional diagram for illustrating fabrication steps' sequence of a light-emitting diode according to a first embodiment of the present invention.
Figure 5B:
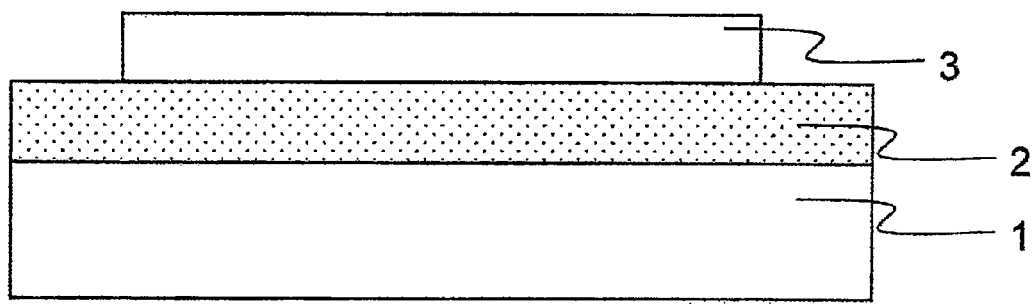
FIG. 5B is a cross-sectional diagram for illustrating the fabrication steps' sequence of the light-emitting diode according to the first embodiment of the present invention.
Figure 5C:
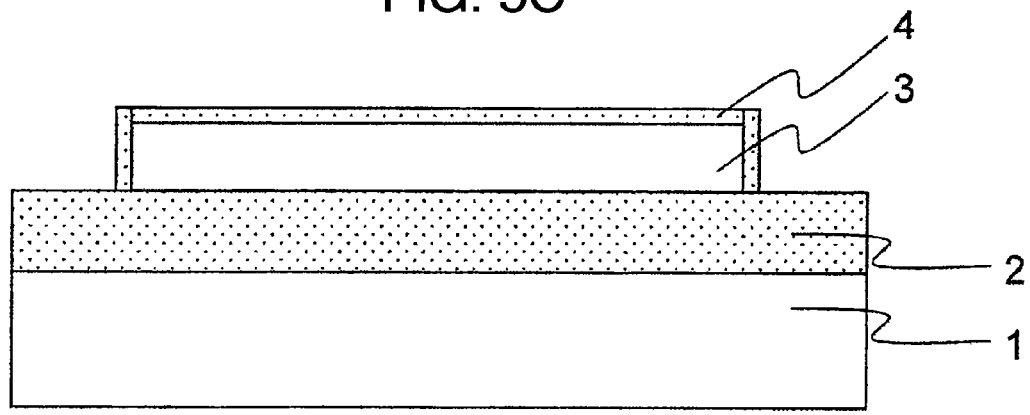
FIG. 5C is a cross-sectional diagram for illustrating the fabrication steps' sequence of the light-emitting diode according to the first embodiment of the present invention.
Figure 5D:
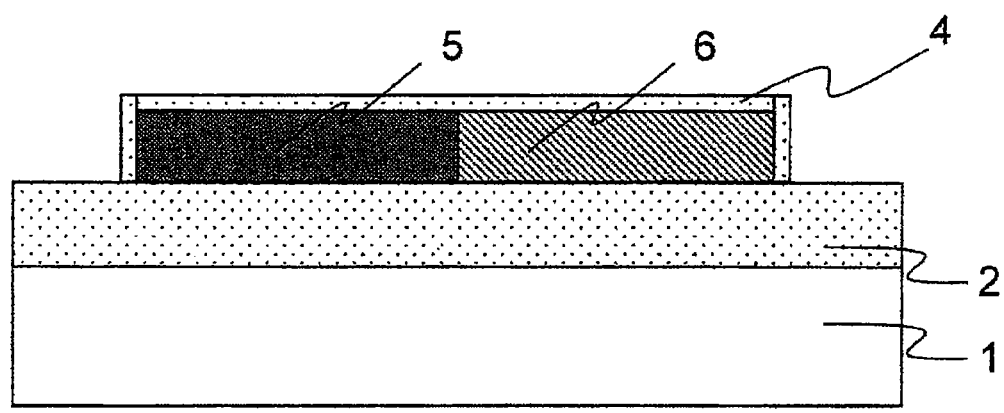
FIG. 5D is a cross-sectional diagram for illustrating the fabrication steps' sequence of the light-emitting diode according to the first embodiment of the present invention.
Figure 5E:
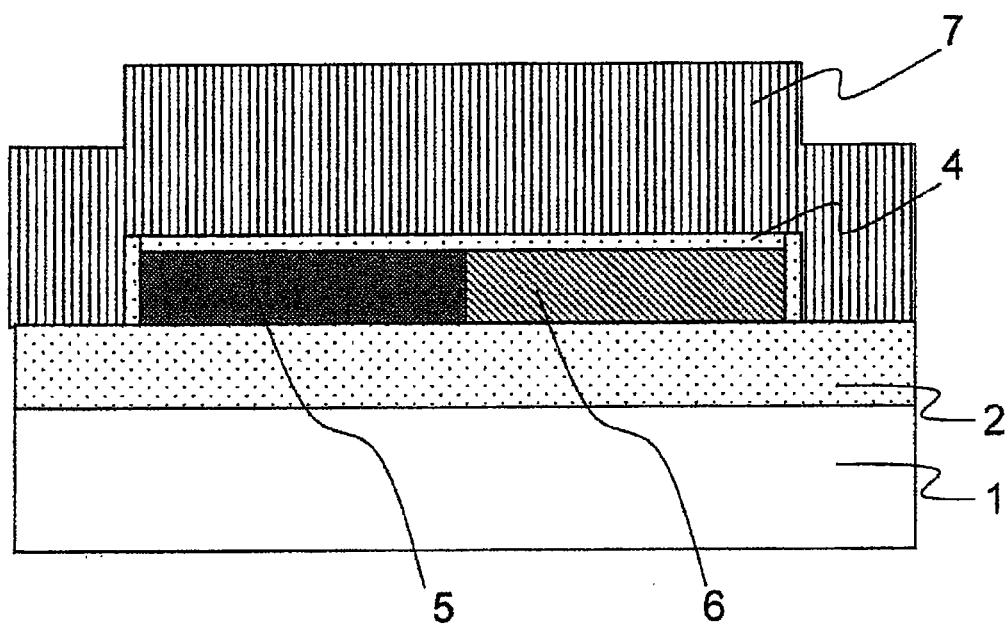
FIG. 5E is a cross-sectional diagram for illustrating the fabrication steps' sequence of the light-emitting diode according to the first embodiment of the present invention.
Figure 5F:
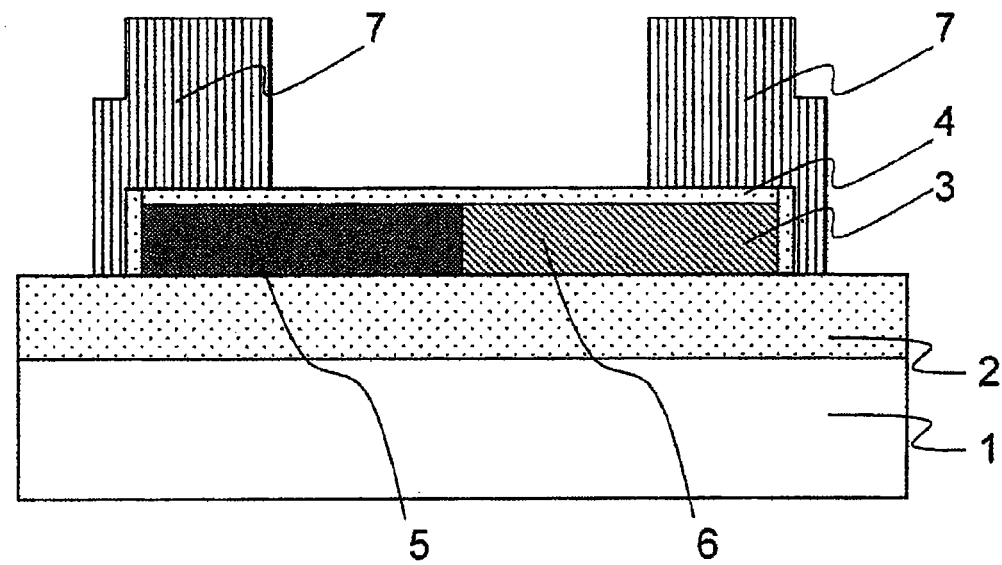
FIG. 5F is a cross-sectional diagram for illustrating the fabrication steps' sequence of the light-emitting diode according to the first embodiment of the present invention.
Figure 5G:
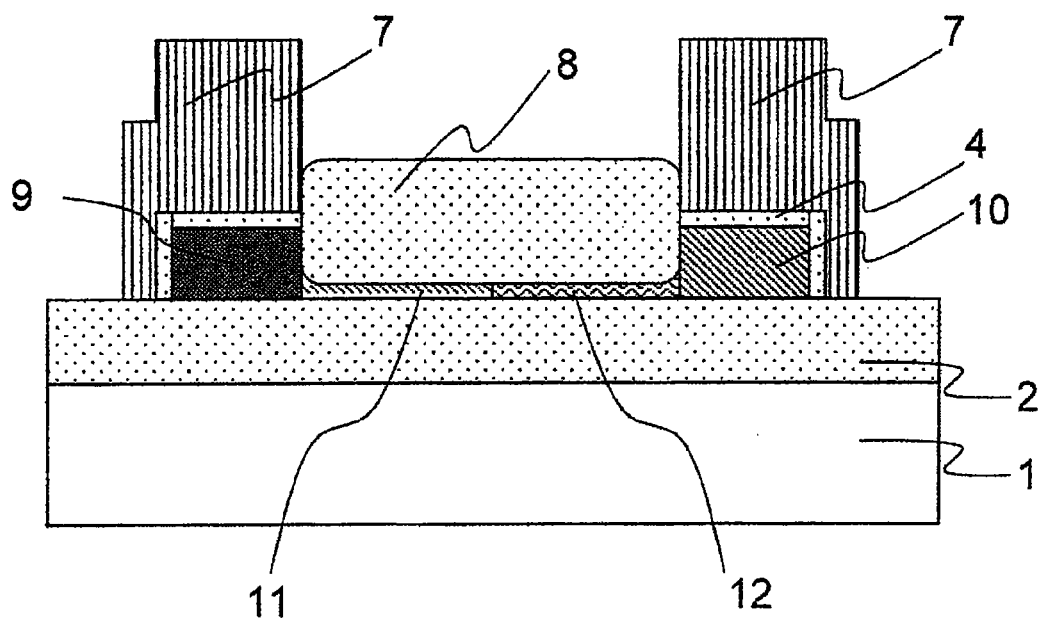
FIG. 5G is a cross-sectional diagram for illustrating the fabrication steps' sequence of the light-emitting diode according to the first embodiment of the present invention.
Figure 5H:
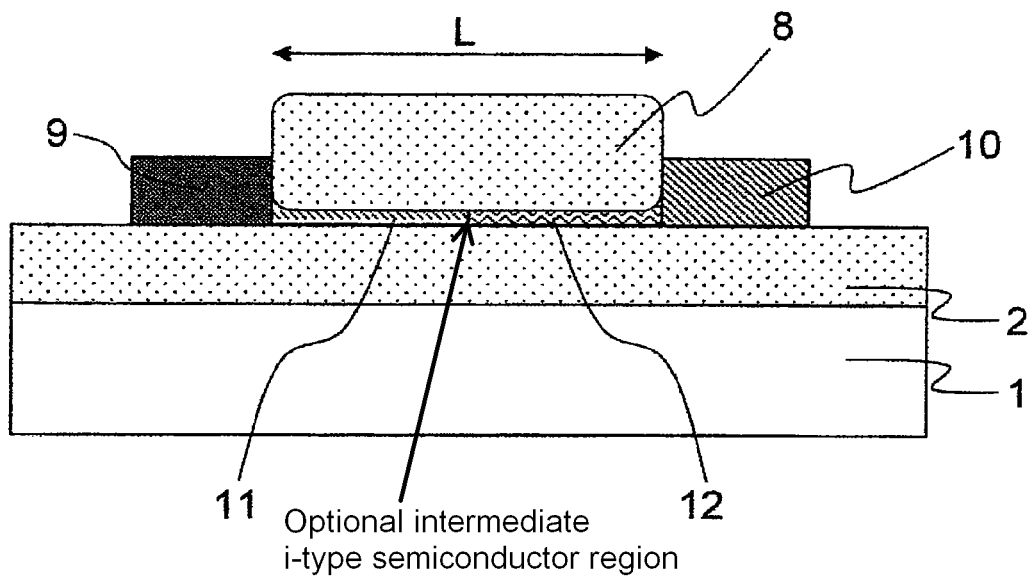
FIG. 5H is a cross-sectional diagram for illustrating the fabrication steps' sequence of the light-emitting diode according to the first embodiment of the present invention.
Figure 6A:
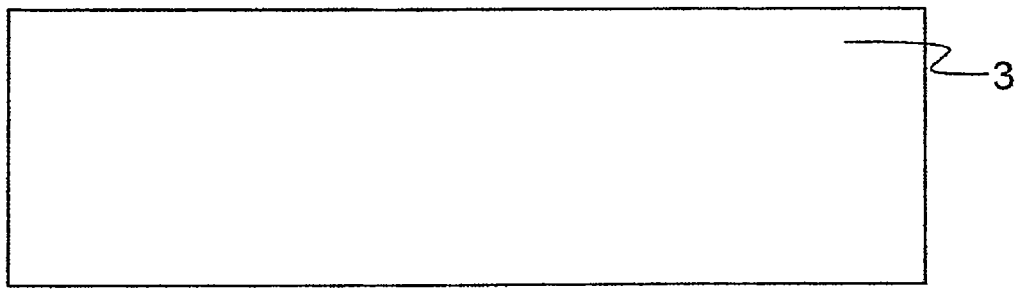
FIG. 6A is a diagram seen from the topside for illustrating the fabrication steps' sequence of the light-emitting diode according to the first embodiment of the present invention.
Figure 6B:
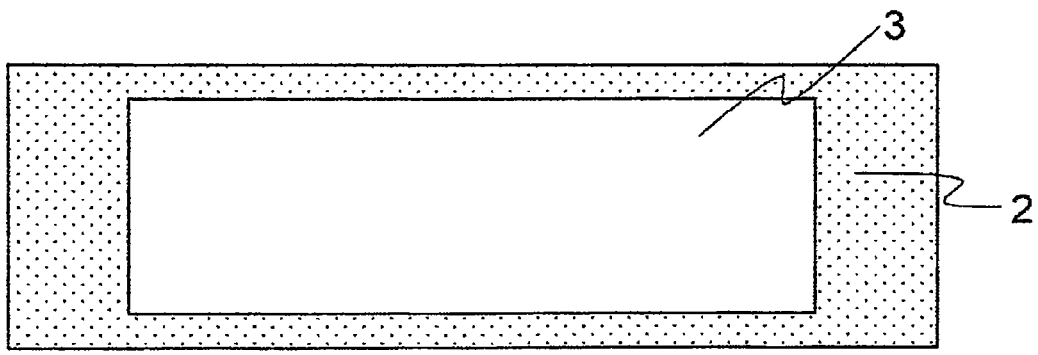
FIG. 6B is a diagram seen from the topside for illustrating the fabrication steps' sequence of the light-emitting diode according to the first embodiment of the present invention.

FIG. 5A to FIG. 5H illustrate cross-sectional structures in the fabrication steps' sequence. Also, FIG. 6A to FIG. 6H illustrate schematic diagrams in the fabrication steps' sequence seen from the topside of a SOI substrate. Here, FIG. 5A to FIG. 5H are transverse-direction cross-sectional diagrams of FIG. 6A to FIG. 6H, respectively. For example, FIG. 5A illustrates a cross-sectional structure cut out by a cross section 13 in FIG. 6H (1). Also, FIG. 7 illustrates a schematic diagram of a cross-sectional structure cut out by a cross section 14 in FIG. 6H (1). FIG. 5H, FIG. 6H (1), FIG. 6H (2), and FIG. 7 illustrate completed diagrams of the device in the present embodiment.

Hereinafter, the explanation will be given below regarding the fabrication steps in accordance with their sequence.

First, as illustrated in FIG. 5A, as a support substrate, a SOI substrate is prepared in which a silicon substrate 1, a buried oxide film (hereinafter, referred to as BOX) 2, and a Silicon-On-Insulator (SOI) layer 3 are multi-layered from below. As illustrated in FIG. 6A, when seen from topside of the SOI substrate, only the SOI layer 3 can be seen. If, however, the SOI substrate is prototyped actually, the lower substrate can be seen in some cases by being permitted to pass therethrough when the thickness of the SOI substrate is thin. Here, a substrate which has a (100) plane on its surface is used as monocrystal silicon of which the Silicon-On-Insulator (SOI) layer 3 is formed. The before-process initial film thickness of the SOI layer 3 prototyped in the present embodiment has been found to be 55 nm. Also, the film thickness of the BOX 2 has been found to be about 150 nm.

Other than the present embodiment, silicon whose surface crystalline structure is a (111) plane as plane orientation of the Silicon-On-Insulator (SOI) layer 3 is prepared. Then, a substrate on which silicon-germanium is epitaxially grown may be prepared thereon. In this case, germanium is concentrated by oxidization which will be described later. As a result, an extremely-thin germanium film whose surface crystalline structure is the (111) plane is formed, thus emitting light with a high efficiency.

Otherwise, in substitution for the Silicon-On-Insulator (SOI) layer 3, a Germanium-On-Insulator (GOI) substrate whose surface crystalline structure is a (111) plane may also be used.

In the present embodiment, the already-existing SOI substrate has been used. It can be easily understood, however, that devising this SOI substrate as well is desirable in order to increase external quantum efficiency. The external quantum efficiency turns out to be an efficiency with which light will be able to be extracted to the outside. Namely, since light has a property of converging into a place with a large permittivity, light is absorbed into the silicon substrate 1 in the above-described structure that the silicon substrate 1 and the BOX 2 exist adjacently. Accordingly, there exists a problem that the amount of light usable for information processing or the like will be decreased.

When the extremely-thin germanium film is used as the light-emitting layer, the absorption like this can be suppressed significantly. This is due to reflection of the fact that bandgap of germanium is smaller than that of silicon.

Also, as another countermeasure against the absorption, it is conceivable that a light-reflecting film is formed between the silicon substrate 1 and the BOX 2. Concretely, it is desirable to insert a layer whose relative permittivity is small, such as a low-k material used at wiring step or the like, between the silicon substrate 1 and the BOX 2. Otherwise, it is desirable to bore a cavity between the silicon substrate 1 and the BOX 2 by using a step of forming Silicon On Nothing or the like. The cavity may be maintained under vacuum, or may remain atmosphere. This is because the relative permittivity in atmosphere is substantially equal to the one under vacuum, i.e., becomes equal to 1. Since the BOX 2 is usually formed of silicon dioxide, its relative permittivity is equal to about 3.9. Then, light is reflected by the low-k material or atmosphere whose refractive index is small. Consequently, much more light can be confined into the BOX 2, thereby being able to be used for information processing or the like.

As still another substrate structure, a high-k material may be used as the BOX 2, such as $HfO_2$ or $ZrO_2$ which becomes a high-permittivity material. These materials have a relative permittivity larger than that of silicon, thereby making it possible to confine light into the BOX 2 without permitting light to pass through the silicon substrate 1. Concerning the high-k materials, a large number of researches and developments are currently being made as materials by which silicon dioxide can be replaced in the gate insulating film in fabricating field-effect transistors. Accordingly, such problems as contamination have been already eliminated, and thus the high-k materials can easily be introduced into the ordinary silicon process. Also, many of the high-k materials are formable using processes such as CVD. Consequently, even if the fabrication steps are started from a substrate where the BOX 2 is formed of silicon dioxide from the beginning, the BOX 2 can be replaced by a high-permittivity material at some subsequent step. Namely, after forming a cavity by partially removing the BOX formed of silicon dioxide, the cavity is filled in with a high-k material by the CVD process. This makes it possible to form the structure that the BOX includes the high-k material. In this case, it turns out that the BOX, which is composed of two types or more materials including the BOX composed of the high-k material and the BOX composed of silicon dioxide, is formed on the same chip. As is well known, the BOX includes the insulating film, and thus operates as a capacitor as well. Accordingly, there exist needs for wishing to raise or lower the permittivity of the BOX depending on the usages. In the case of the present embodiment, there exist needs for wishing to raise the permittivity of the BOX in a device adjacent to the light-emitting layer, but for wishing to reduce the capacitance in order to shorten a delay time on the periphery of a wiring. Also, when forming a fully-depleted field-effect transistor in the SOI layer, raising the permittivity of the BOX allows implementation of the electrical control from the substrate side. This makes it possible to fabricate a device which is resistant to the short-channel effect. In this way, forming the BOX on the chip in the partial and separated manner brings about the various merits.

Next, after coating photoresist thereon, the photoresist is left behind in only a desired region by a mask exposure based on photolithography. After that, an anisotropy dry etching is applied to the photoresist, thereby machining the Silicon-On-Insulator (SOI) layer 3 into a mesa-like shape as is illustrated in FIG. 5B and FIG. 6B. It is needless to say that, although, in the drawings, only one device is illustrated for simplicity, a large number of devices are simultaneously formed on the substrate. The use of the silicon process allows the large number of devices to be integrated with a high yield.

Subsequently, although not illustrated, a processing for rounding an edge of the Silicon-On-Insulator (SOI) layer 3 machined into the mesa-like shape is applied thereto by applying an isotropy dry etching thereto. The application of the edge-rounding processing like this prevents that, when an oxidization processing is applied thereto at the next step, a tension will be concentrated on only the edge portion, and thus the oxidization will not proceed. Namely, if the edge-rounding processing is not applied thereto, the Silicon-On-Insulator (SOI) layer 3 in the edge periphery portion becomes thicker as compared with the surroundings. As a result, there occurs a problem that, when current is caused to flow, the current will flow in a manner of being concentrated on this region, and thus the light-emission efficiency will be lowered. In the present embodiment, the countermeasure is taken in advance against this point. Also, it is needless to say that, as the processing for rounding the edge of the Silicon-On-Insulator (SOI) layer 3, in addition to the isotropy dry etching performed in the present embodiment, other fabrication methods, such as application of high-temperature annealing and application of wet etching, can also address the requirements.

Also, instead of machining the Silicon-On-Insulator (SOI) layer 3 into the mesa-like shape as is performed in the present embodiment, the device isolation may also be applied thereto by using such methods as Shallow Trench Isolation (STI) and Local Oxidization of Si (LOCOS) processing steps.

Figure 6C:
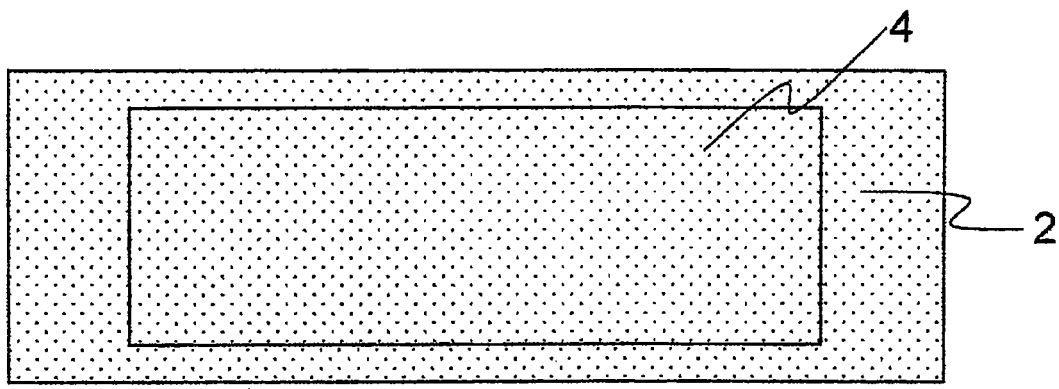
FIG. 6C is a diagram seen from the topside for illustrating the fabrication steps' sequence of the light-emitting diode according to the first embodiment of the present invention.
Figure 7:
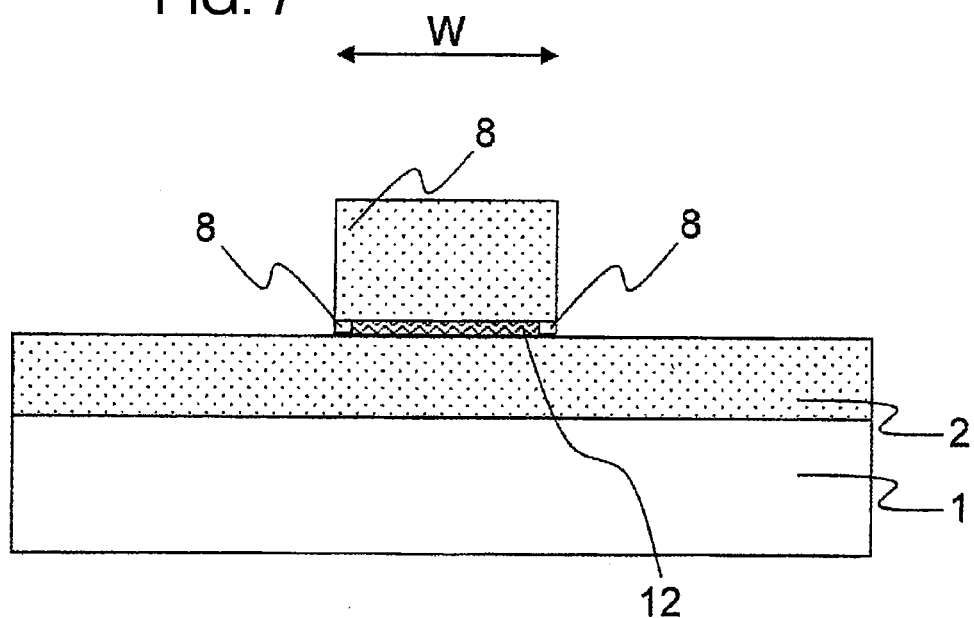
FIG. 7 is a cross-sectional diagram of the light-emitting diode according to the first embodiment of the present invention.

Subsequently, in order to protect surface of the SOI layer 3, the surface is oxidized in thickness to about 15 nm, thereby forming a silicon dioxide film 4 as is illustrated in FIG. 5C and FIG. 6C. The silicon dioxide film 4 plays a role of not only reducing a damage that the substrate undergoes by an ion implantation to be introduced in the next process, but also suppressing impurities from escaping into atmosphere by an activation thermal processing.

Subsequently, the photoresist is left behind in only a desired region by a resist patterning using photolithography. After that, ion implantation of $BF_2$ ions is performed with 15-KeV acceleration energy and in $1\times10^{15}$-/$cm^2$ dose amount, thereby forming a p-type impurity-implanted region 5 within the SOI layer 3.

Subsequently, after removing the photoresist, again, the photoresist is left behind in only a desired region by the resist patterning using photolithography. After that, ion implantation of P ions is performed with 10-KeV acceleration energy and in $1\times10^{15}$-/$cm^2$ dose amount, thereby forming an n-type impurity-implanted region 6 within the SOI layer 3. FIG. 5D illustrates this state. Although a drawing seen from the topside is FIG. 6D (1), FIG. 6D (1) does not show the manner in which the ions are implanted. Accordingly, instead, FIG. 6D (2) illustrates the manner of the underside portion of the silicon dioxide film 4. Actually, the inspection had been made using an optical microscope during the fabrication step. Then, since the silicon dioxide film 4 is glass, the underside portion could be seen by being permitted to pass through the silicon dioxide film 4. As a result, it has been confirmed that, as illustrated in FIG. 6D (2), the regions into which the different impurities are implanted look somewhat different in color.

In this ion implantation step, the portion of the SOI layer 3 into which the ions are implanted is transformed into amorphous, and accordingly the crystalline property becomes worse. Then, although not illustrated in the drawings, what is important is as follows: Namely, it is designed to permit only the surface of the SOI layer 3 to be transformed into the amorphous, and also to permit the single-crystalline silicon to remain in the region where the SOI layer 3 and the BOX 2 are adjacent to each other. Setting the acceleration energy for the ion implantation at a too high value transforms into the amorphous the whole region of the SOI layer 3 into which the ions are implanted. Accordingly, there occurs a problem that, even if an annealing processing later is applied, the single-crystalline property is not restored, and thus the whole region becomes the poly crystal. Employing the ion implantation conditions as are set in the present embodiment permits the single-crystalline silicon to remain in this way. Consequently, processings such as an activation thermal processing after the ion implantation allow the single-crystalline property to be restored. As described above, the existence of the good single-crystalline property is of the utmost importance in order to cause the device to emit light with a high efficiency.

Figure 6D:
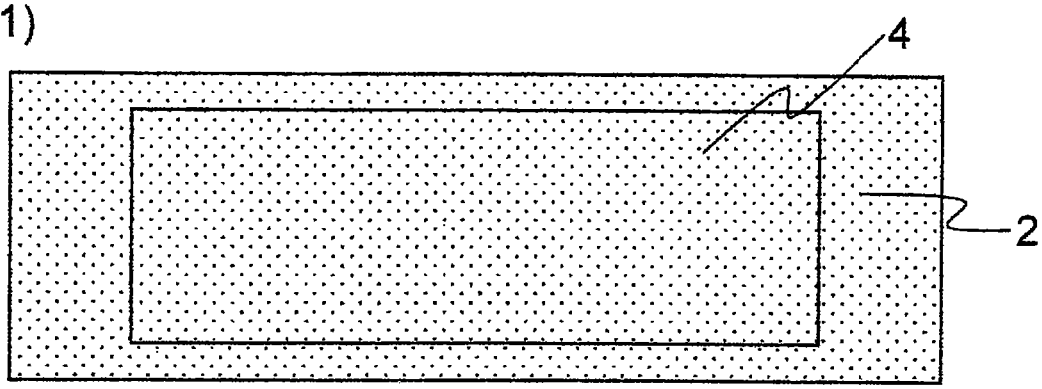
FIG. 6D is a diagram seen from the topside for illustrating the fabrication steps' sequence of the light-emitting diode according to the first embodiment of the present invention.
Figure 6D:
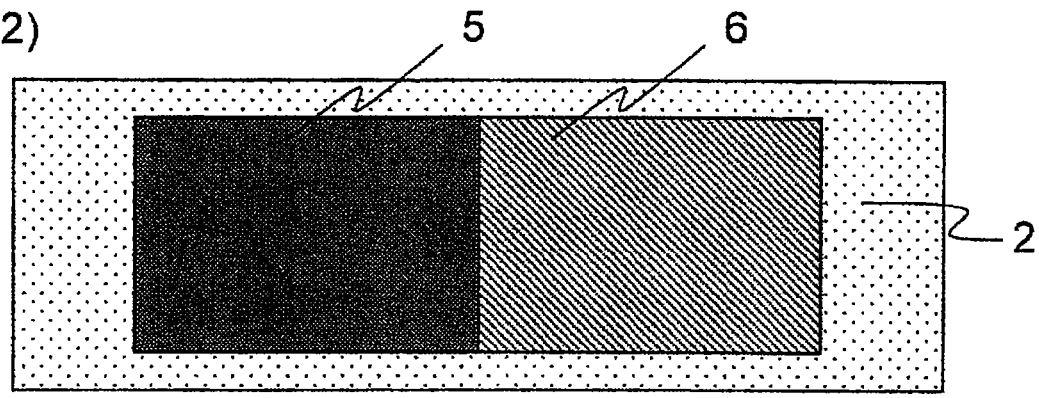

Also, although, in FIG. 5D and FIG. 6D (2), the p-type impurity-implanted region 5 and the n-type impurity-implanted region 6 are provided adjacently with each other, it is allowable if they are not provided adjacently. When the mask is used at the fabrication step, an alignment shift occurs in some cases. In that case, the p-type impurity-implanted region 5 and the n-type impurity-implanted region 6 are separated or overlapped with each other.

In fact, in the present embodiment as well, a diode, where the SOI layer 3 to which the ion implantation is not applied, i.e., an i-type region (as diagrammatically indicated in FIG. 5H), is left between the p-type impurity-implanted region 5 and the n-type impurity-implanted region 6, is simultaneously fabricated intentionally by setting the mask pattern appropriately. The diode including the region (i.e., i region) into which the ions are not implanted in this way is referred to as a pin diode. In the present invention, both the p-n diode formed of the extremely-thin silicon layer and the pin diode are formed simultaneously.

Also, conversely, the p-type impurity-implanted region 5 and the n-type impurity-implanted region 6 may be overlapped with each other. In a region in which both of them are overlapped with each other, both of their impurities are doped, thus being canceled out. This state, eventually, exhibits characteristics similar to those of the pin diode. An advantage obtained by being formed into the pin diode is as follows: Using an oxidization step which will be described later, a washing step and the oxidization step are adjusted skillfully and delicately so that, e.g., the i region will be made thicker to some extent (about a few nm). This brings about the advantage of becoming capable of confining both carriers, i.e., electrons and holes, into the i layer. Having prototyped the pin diode actually, the control like this has been found to be implementable, because the region into which the ions are implanted is easier to shave at the washing step or the like. This control is based on the utilization of the quantum confinement effect described earlier. Namely, taking advantage of the property that the bandgap effectively becomes larger as the film thickness becomes thinner, the region with a somewhat narrower bandgap is set up in between, thereby making it easier for both of the carriers to gather there. This is a concept which resembles the double hetero structure used in the compound semiconductors. Nevertheless, the double hetero structure is completely different from the structure of the present invention, because the two types of different semiconductors are used in the compound semiconductors. In the present invention, as is obvious from the fact that the one type of semiconductor material is used, no hetero junction is found in the injection layer for the carriers and the light-emitting layer. Namely, there exists none of a hetero-junction boundary interface as is implied by the word of the double hetero. What is more, the light-emission is enhanced by forming the extremely-thin film using the IV semiconductor materials which exhibit an extremely bad light-emission efficiency in the bulk state. Moreover, the carriers with both polarities are confined by merely adjusting the film thickness partially in this way. Namely, there exists none of the junction boundary interface and, if we dare to say, the structure of the present invention can be said to be a double homo junction of regions with different film thicknesses. Also, concerning the device structure as well, in the double hetero structure of the ordinary compound semiconductors, the p-n junction is formed in the direction orthogonal to the substrate. In contrast thereto, in the present invention, the p-n junction is formed in the direction parallel to the substrate. Consequently, shapes of the devices are also completely different.

Furthermore, adjusting the film thickness partially with a good controllability merely requires that the oxidization step be applied to only a desired region by applying the mask partially. Accordingly, the use of the silicon process allows this adjustment to be easily implemented. For example, a silicon nitride film is deposited on only the topside portion of the above-described i region, and the other region is oxidized in thickness to slightly about 1 nm. Merely doing this makes it possible to implement this adjustment. As is understood by converting the calculation result in FIG. 4A into eV, the difference of only the 1-nm film thickness with reference to the surroundings makes it possible to easily generate a difference in energy of about 100 meV. Since the carriers at room temperature have kinetic energy of only about 26 meV, the energy barrier like this is high and strong enough to confine the carriers.

Subsequently, the activation thermal processing may be applied, thereby activating the impurities, and restoring the single-crystalline property of the SOI layer 3 which has undergone the damage by the ion implantation processing. In the present embodiment, however, the activation thermal processing is not performed here for simplifying the number of the steps. Instead, a fabrication step of performing the oxidization processing simultaneously with the activation of the impurities is employed as will be described hereinafter. The employment of this fabrication step allows a reduction in the number of the steps, thereby allowing a reduction in the fabrication cost. Here, if the thermal processing for the activation and the single-crystalline property is applied, no problem will occur.

Also, after performing the activation thermal processing here, again, the ion implantation processing is applied. This makes it possible to enhance the impurity concentration further. The enhancement in the impurity concentration here allows suppression of the amount by which the impurity concentration is lowered by a phenomenon that the oxidization processing diffuses part of the impurities to the silicon dioxide.

Figure 6E:
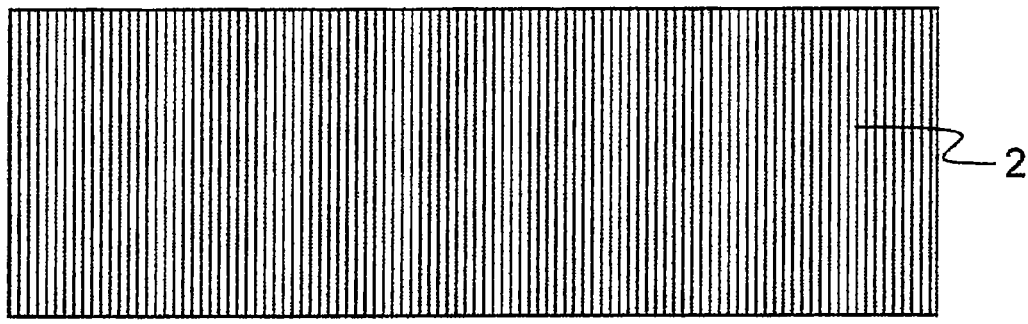
FIG. 6E is a diagram seen from the topside for illustrating the fabrication steps' sequence of the light-emitting diode according to the first embodiment of the present invention.
Figure 6F:
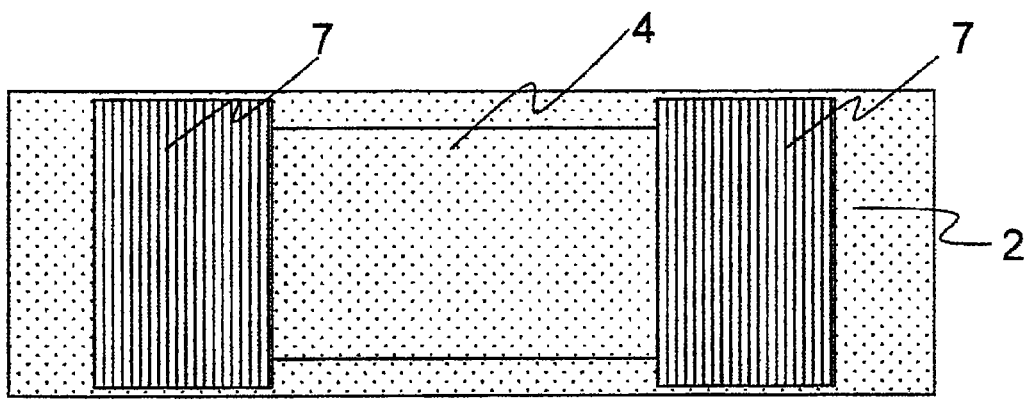
FIG. 6F is a diagram seen from the topside for illustrating the fabrication steps' sequence of the light-emitting diode according to the first embodiment of the present invention.

Next, a silicon nitride film 7 is deposited on the entire surface in about 100-nm thickness, thereby resulting in the state in FIG. 5E and FIG. 6E.

Subsequently, the photoresist is left behind in only a desired region by the resist patterning using photolithography. After that, the silicon nitride film 7 is machined using an anisotropy dry etching, thereby resulting in the state in FIG. 5F and FIG. 6F.

Subsequently, after applying the washing step, the oxidization processing is performed, thereby performing a processing of making the desired region of the SOI layer 3 thinnest to the limit. Here, oxidization condition is of the utmost importance. We have confirmed that, in the oxidization processing at 1000° C.-or-less temperature used frequently in the ordinary silicon process, a difference of about two times at the maximum occurs between the film thickness of silicon dioxide formed in the p-type impurity-implanted region 5 and the film thickness of silicon dioxide formed in the n-type impurity-implanted region 6. As described earlier, causing the silicon to emit light with a high efficiency requires that the film thickness of the SOI layer 3 be made thinner than the mean free path 1. Since, in silicon, magnitude of the mean free path 1 at room temperature is equal to about 10 nm, the film thickness of the SOI layer 3 needs to be set at 10 nm or less, or preferably, 5 nm or less. In order to enable the extremely-thin film like this to be uniformly formed, it is not permissible that oxidization rate differs depending on the conduction types of the impurity ions. The reason for this is as follows: When the region of one conduction type is set at 5 nm or less, if a difference exists in the oxidization rate, the region of the other conduction type eventually has only two alternatives, i.e., the region becomes too thick, or is oxidized all and thus vanishes. We have found out that, by applying a dry oxidization processing at 1100° C. oxidization temperature, the difference between the film thickness of silicon dioxide formed in the p-type impurity-implanted region 5 and the film thickness of silicon dioxide formed in the n-type impurity-implanted region 6 can be suppressed down to about 1 nm even in the case of the condition of forming a 100-nm oxide film. Unless the oxidization condition is set at the optimum one like this, the light-emitting diode of the present invention cannot be fabricated.

Figure 6G:
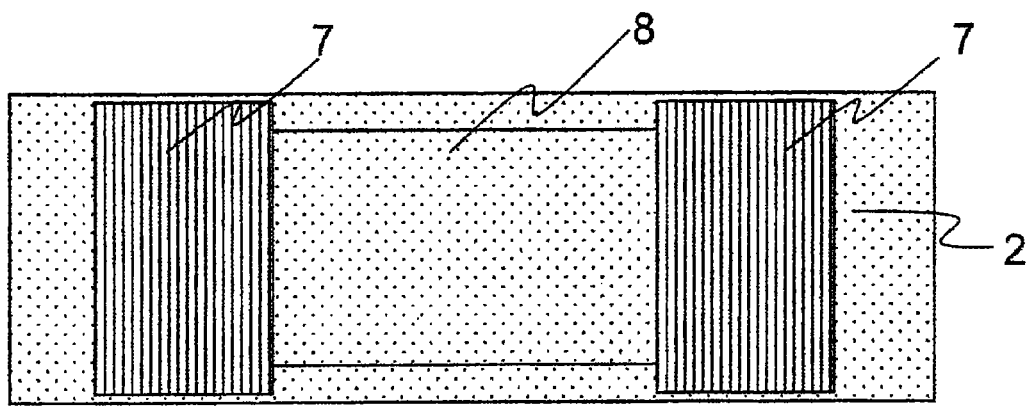
FIG. 6G is a diagram seen from the topside for illustrating the fabrication steps' sequence of the light-emitting diode according to the first embodiment of the present invention.
Figure 6H:
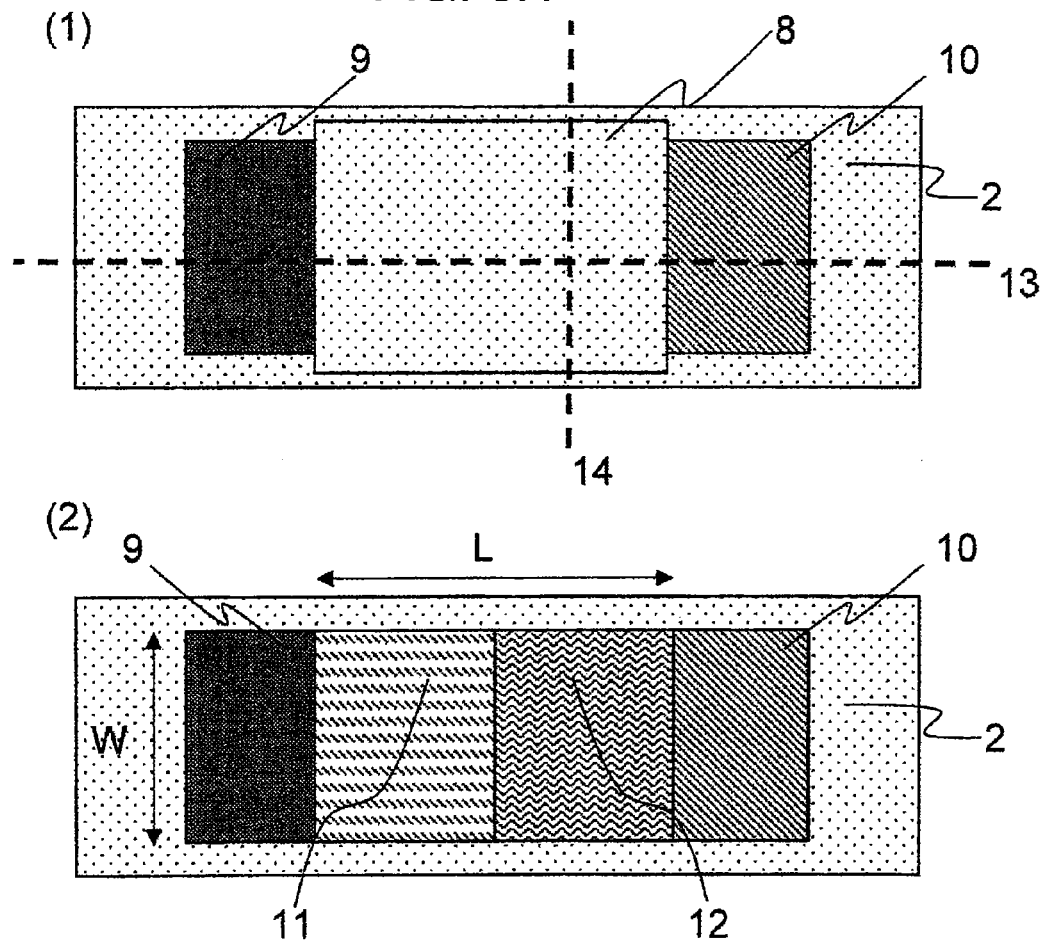
FIG. 6H is a diagram seen from the topside for illustrating the fabrication steps' sequence of the light-emitting diode according to the first embodiment of the present invention.

In the present embodiment, the silicon dioxide film 8 has been formed by the dry oxidization processing at the 1100° C. oxidization temperature so that the silicon dioxide film 8 becomes equal to about 90 nm thick. As a consequence, film thickness of the extremely-thin silicon film has been able to be made equal to about 5 nm. Also, at this time, the difference in film thickness between the p-type impurity-doped region (i.e., p-type semiconductor region) and the n-type impurity-doped region (i.e., n-type semiconductor region) has been able to be suppressed down to about 1 nm or less. At the time of this oxidization processing, it is requested to inspect in detail the film thickness of the remaining silicon layer while observing the film thickness of the extremely-thin silicon film with an accuracy of 1 nm or less by using a spectroscopic ellipsometer. In the present embodiment, the formation of the oxide film has been not performed at one time, but has been performed in a manner of being divided into a plurality of steps. Namely, the oxidization processing is performed up to a certain extent of film thickness, then taking out the wafer. Next, the film thickness is evaluated using the spectroscopic ellipsometer, then performing the oxidization processing once again. For the mass production, it is desirable that the spectroscopic ellipsometer be build in an oxidization apparatus. Also, it is desirable that a pattern for inspecting the film thickness be prepared in advance within a wafer to be produced. In the present embodiment, as illustrated in the light-emission region in FIG. 2 or FIG. 3, by preparing an about 1-cm²-sized pattern for the inspection within the wafer, the oxidization processing has been performed while inspecting in detail the film-thickness distribution within the wafer surface. Also, the 1100° C. oxidization temperature is a temperature which is high enough to activate the ions. Accordingly, this oxidization processing activates the impurities introduced by the ion implantation, thereby forming a p-type SOI region 9, an n-type SOI region 10, a p-type extremely-thin silicon region 11, and an n-type extremely-thin silicon region 12, respectively. FIG. 5G and FIG. 6G illustrate this state.

Subsequently, the silicon nitride film 7 is eliminated by applying the washing step and a wet etching with thermal phosphoric acid. After that, a hydrogen annealing processing is applied at 400° C. temperature, thereby performing a processing of performing hydrogen-termination of defects which have occurred during the process. As a result, the completed cross-sectional view of the completed light-emitting diode is illustrated in FIG. 5H. Although a drawing seen from the topside is FIG. 6H (1), FIG. 6H (1) does not show the manner in which the ions are implanted. Accordingly, instead, FIG. 6H (2) illustrates the manner of the underside portion of the silicon dioxide film 8. Also, FIG. 7 illustrates the schematic diagram in the case of being cut out by the cross section 14. FIG. 7 indicates the manner in which a side-wall portion adjacent to the n-type extremely-thin silicon region 12 is oxidized thereby to become the silicon dioxide film 8.

After this, a desired wiring step is performed. This has completed the high-efficiency silicon light-emitting diode formed on the silicon substrate 1.

Figure 8:
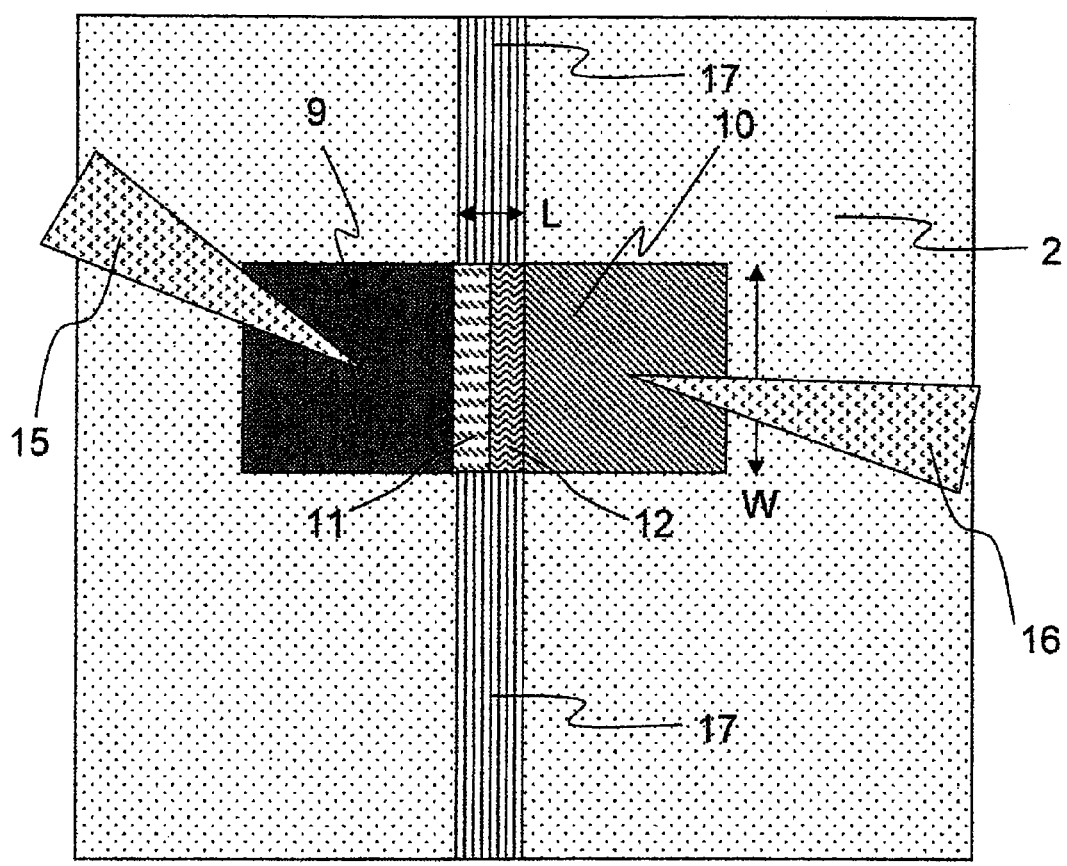
FIG. 8 is an explanatory diagram for explaining a light-emission verification experiment of the light-emitting diode according to the first embodiment of the present invention.
Figure 9A:
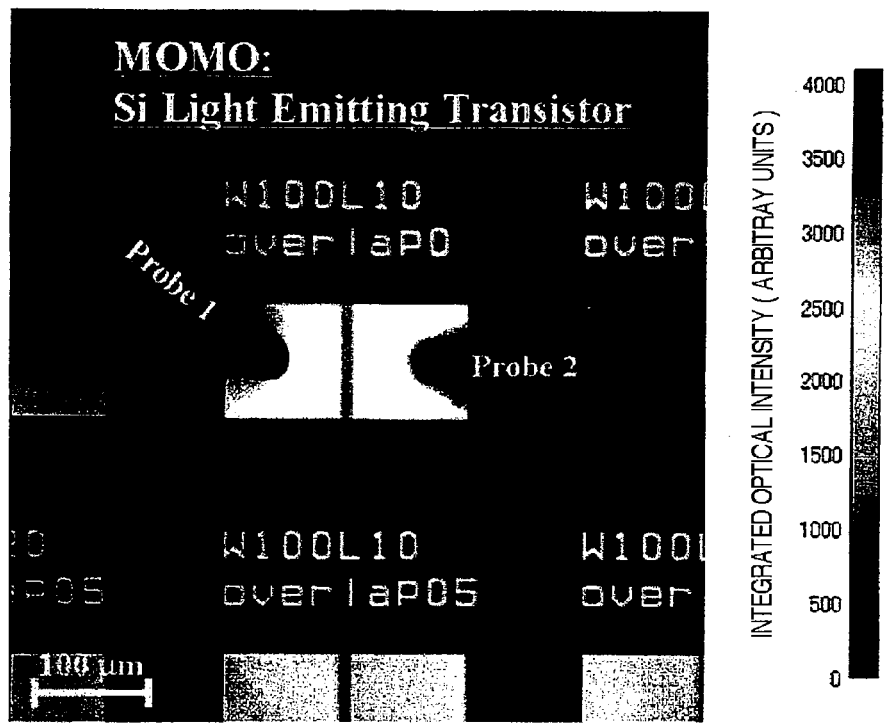
FIG. 9A is a light-emission photograph of the light-emitting diode according to the first embodiment of the present invention.
Figure 9B:
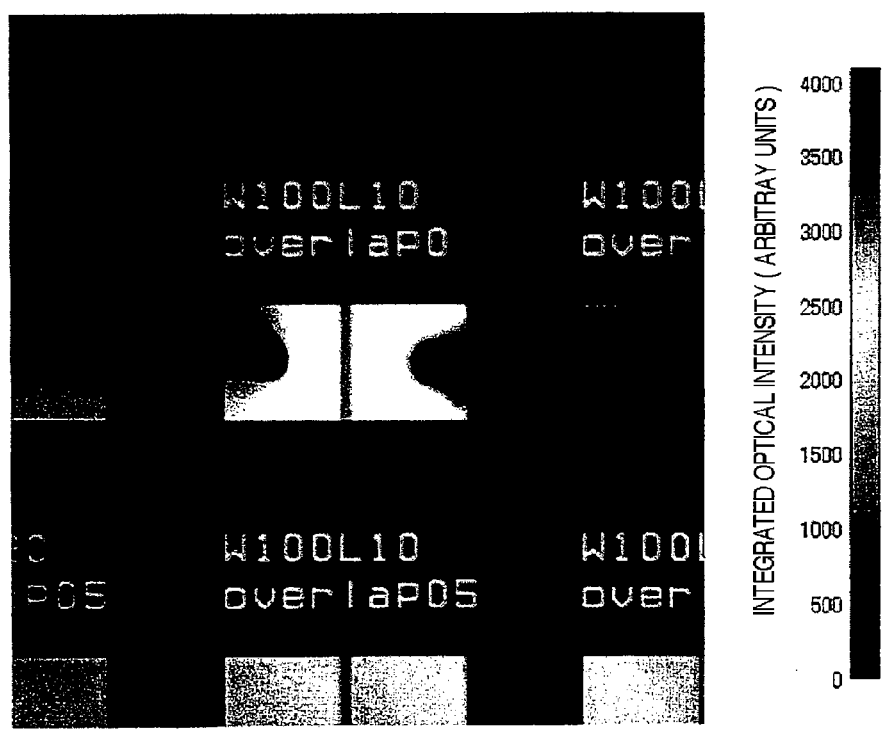
FIG. 9B is a light-emission photograph of the light-emitting diode according to the first embodiment of the present invention.
Figure 9C:
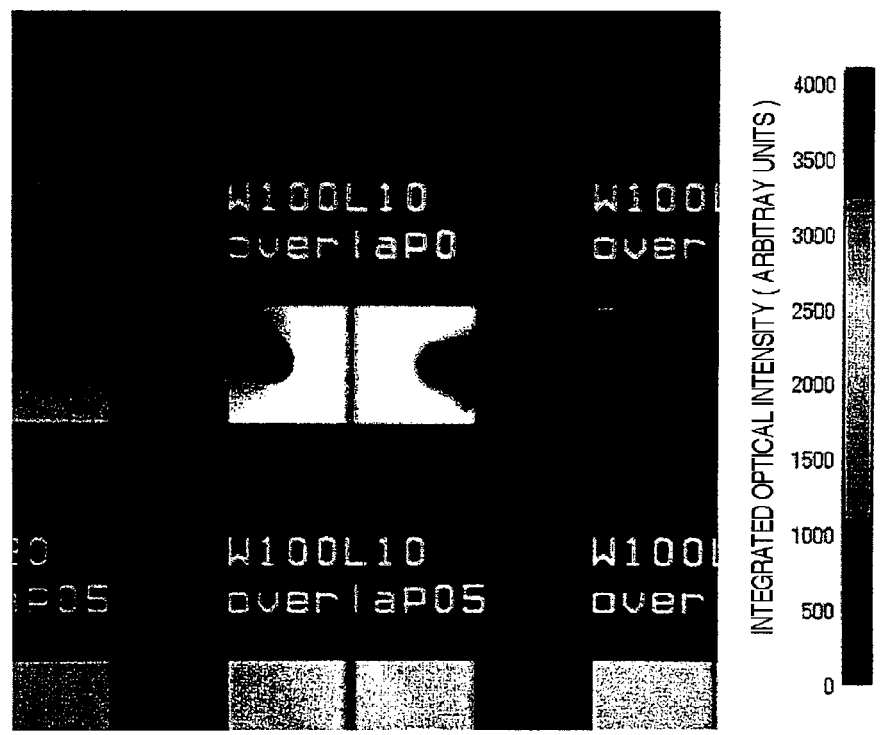
FIG. 9C is a light-emission photograph of the light-emitting diode according to the first embodiment of the present invention.
Figure 9D:
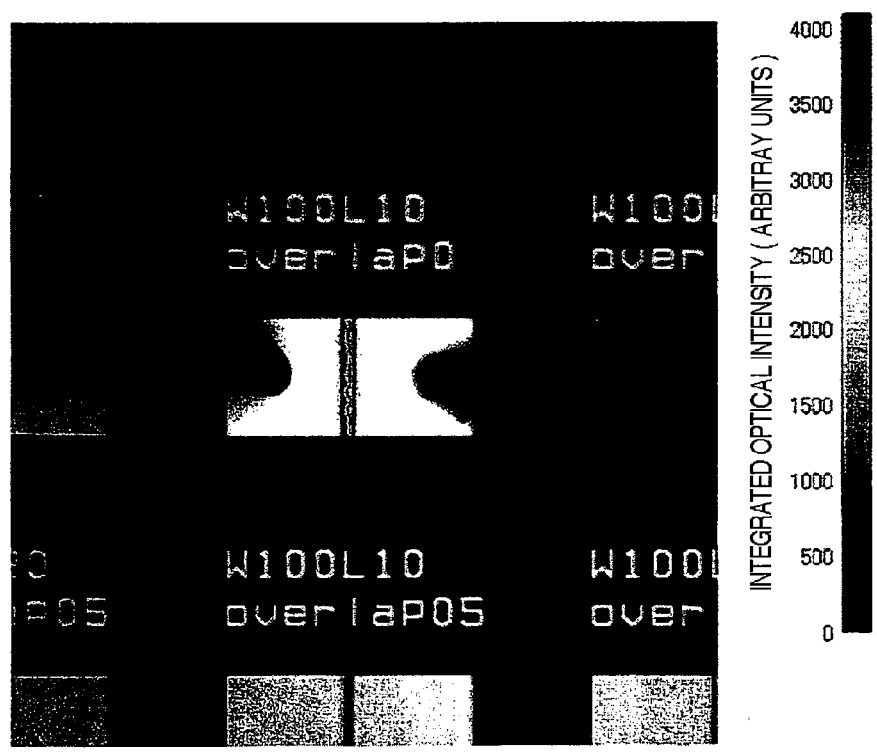
FIG. 9D is a light-emission photograph of the light-emitting diode according to the first embodiment of the present invention.
Figure 9E:
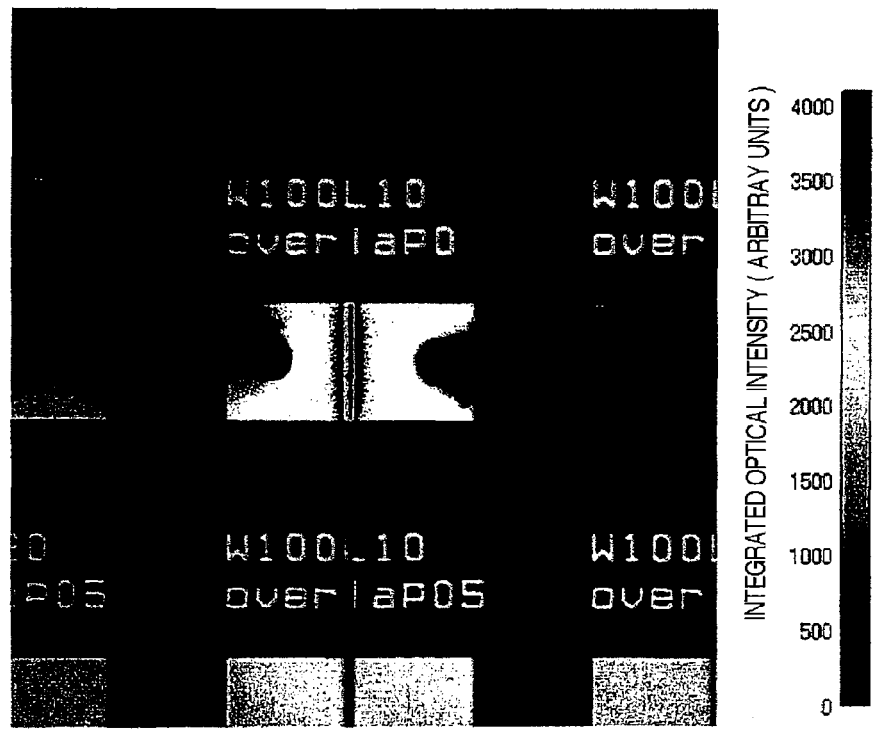
FIG. 9E is a light-emission photograph of the light-emitting diode according to the first embodiment of the present invention.
Figure 9F:
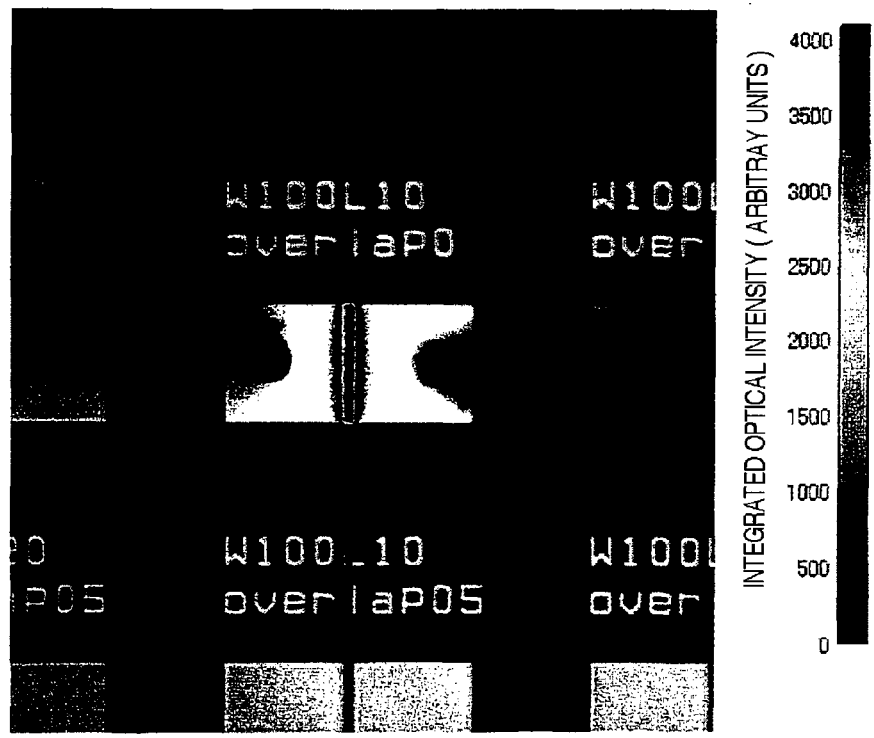
FIG. 9F is a light-emission photograph of the light-emitting diode according to the first embodiment of the present invention.
Figure 10A:
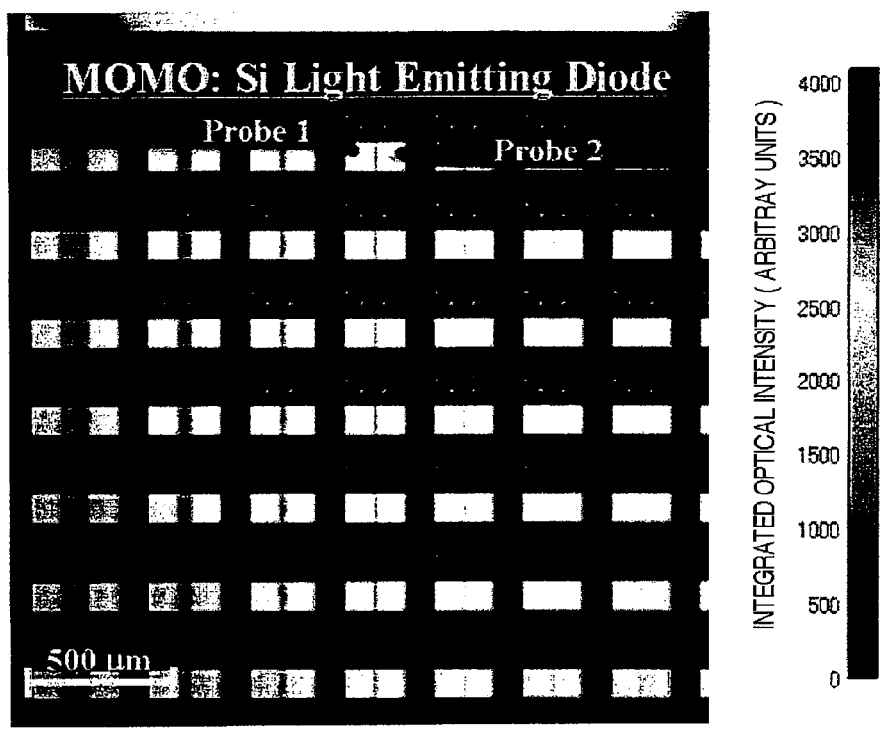
FIG. 10A is a light-emission photograph of the light-emitting diode according to the first embodiment of the present invention.
Figure 10B:
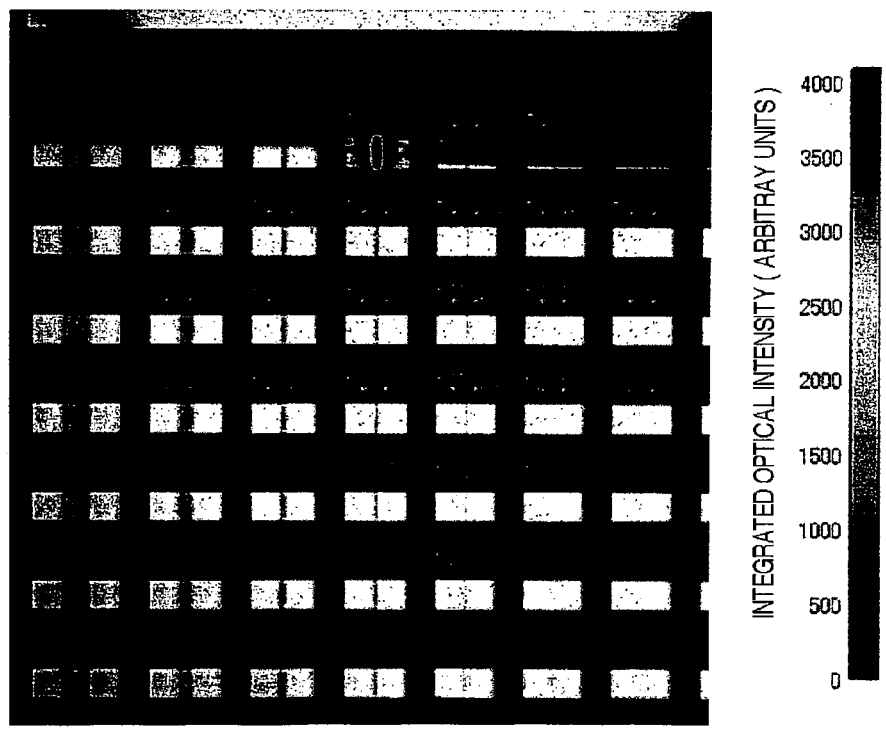
FIG. 10B is a light-emission photograph of the light-emitting diode according to the first embodiment of the present invention.
Figure 10C:
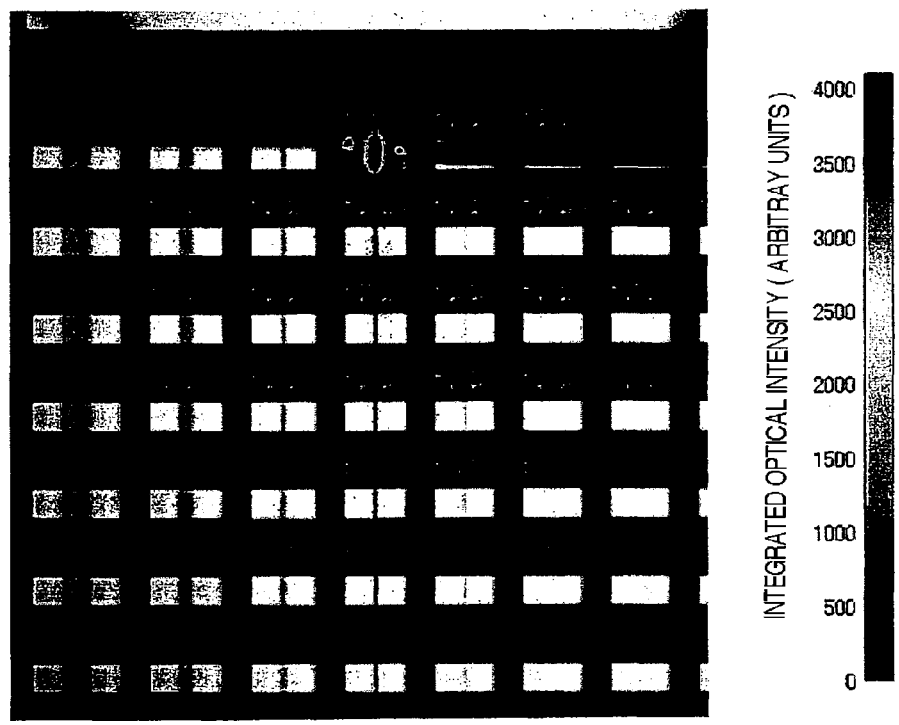
FIG. 10C is a light-emission photograph of the light-emitting diode according to the first embodiment of the present invention.
Figure 10D:
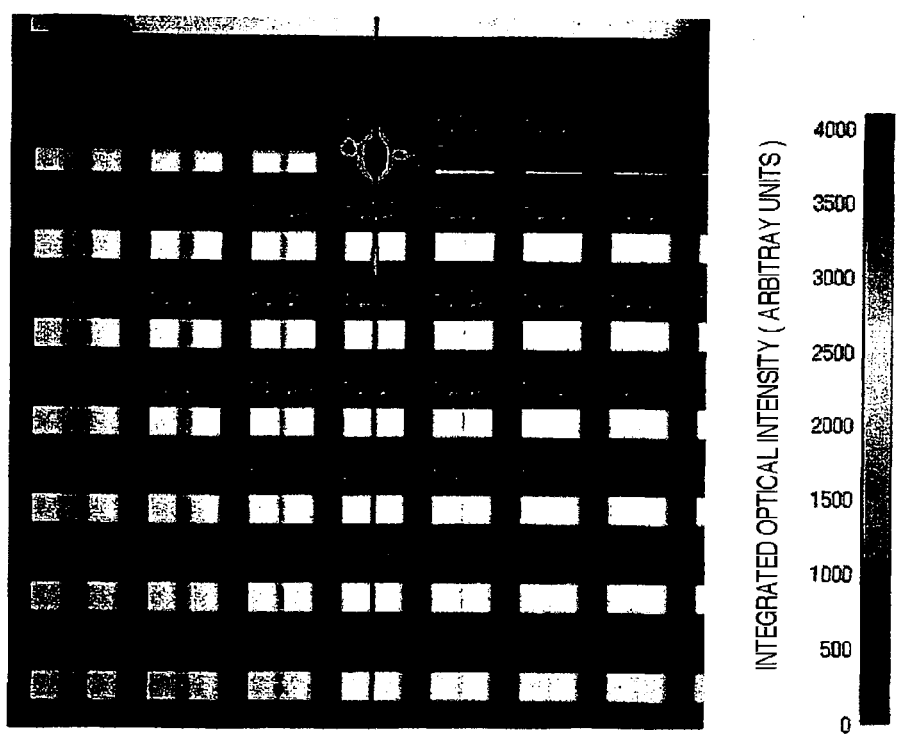
FIG. 10D is a light-emission photograph of the light-emitting diode according to the first embodiment of the present invention.
Figure 10E:
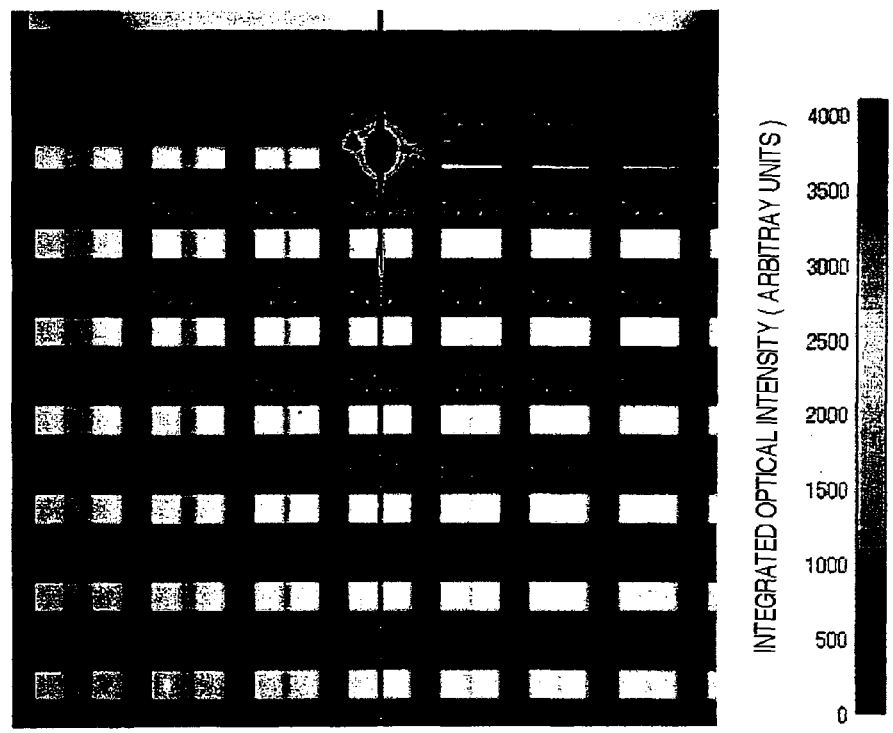
FIG. 10E is a light-emission photograph of the light-emitting diode according to the first embodiment of the present invention.
Figure 10F:
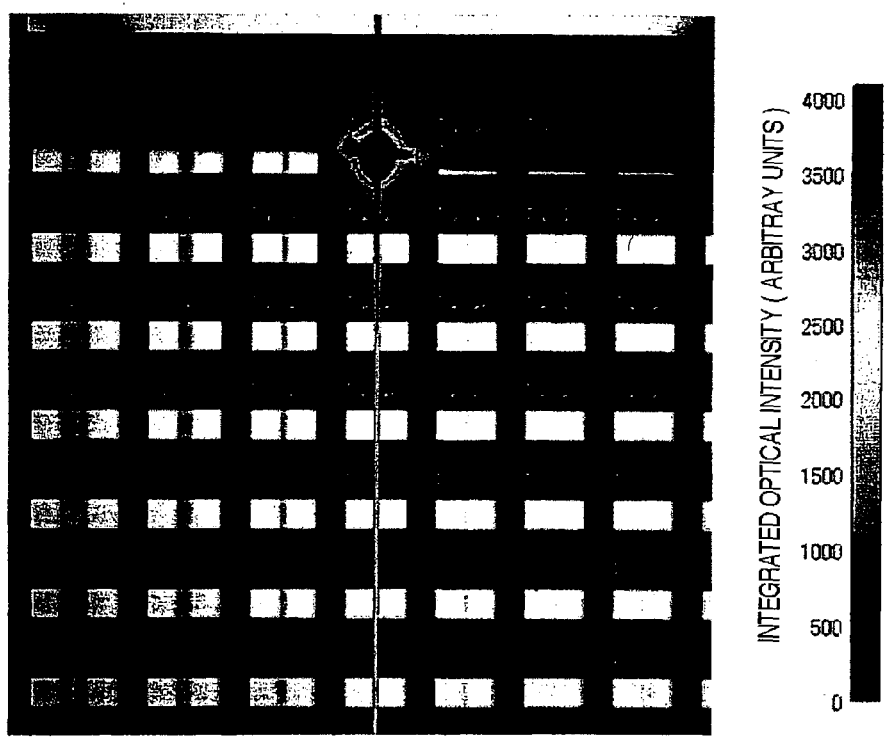
FIG. 10F is a light-emission photograph of the light-emitting diode according to the first embodiment of the present invention.

FIG. 8 schematically illustrates a measurement method at the time of investigating characteristics of the silicon light-emitting diode according to the present embodiment. A probe needle 15 is connected to the p-type SOI region 9, and a probe needle 16 is connected to the n-type SOI region 10. Causing current to flow between the probe needle 15 and the probe needle 16 has allowed acquisition of the diode characteristics. What is more, the threshold value for the current-voltage characteristics has reflected the amount of the increase in the bandgap, which had been indicated in FIG. 4A. Also, the measurement has been also made regarding silicon light-emitting diodes which are fabricated in accordance with steps similar to those in the present embodiment, and where the film thickness of the p-type extremely-thin silicon region 11 and that of the n-type extremely-thin silicon region 12 are designed to be different, i.e., 13.6 nm, 6.3 nm, 4.0 nm, and 1.3 nm. As a result of this measurement, the bandgap increase's dependence on the film thickness indicated in FIG. 4A has been clearly observed. FIG. 4B illustrates the spectrum by the photoluminescence. FIG. 4B shows the manner in which the light-emission intensity becomes skyrocketingly higher and higher as the film thickness of the extremely-thin silicon regions becomes smaller. Moreover, as illustrated in FIG. 8, light-emission 17 is emitted from the p-type extremely-thin silicon region 11, the n-type extremely-thin silicon region 12, and the boundary interface therebetween. In FIG. 8, although, for easy understanding, the light-emission 17 is not illustrated in a manner of being superimposed on topside of the p-type extremely-thin silicon region 11 and the n-type extremely-thin silicon region 12, it is needless to say that the light-emission 17 is emitted in the upward direction as well. Also, as illustrated in FIG. 8, the light-emission 17 travels in the direction parallel to the substrate as well.

Next, FIG. 9A to FIG. 9F illustrate, in contrast, light-emission images obtained in the case of applying forward biases to the p-n junction by the amount of 0, 1, 2, 3, 4, and 5 V, respectively. FIG. 9A to FIG. 9F also illustrate photographs displayed by superimposing the light-emission images on optical images of the device element photographed simultaneously. Width W of this device element is equal to 100 µm, and length L of the extremely-thin silicon film including both of the p-type extremely-thin silicon region 11 and the n-type extremely-thin silicon region 12 is equal to 10 µm. Incidentally, in FIG. 9A, a longitudinal-direction and gray-colored belt-like-looking portion between a probe 1 and a probe 2 is the region where the p-type extremely-thin silicon region 11 and the n-type extremely-thin silicon region 12 are formed. The light-emission intensity is indicated, which shows that the light-emission intensity from the place where the p-type extremely-thin silicon region 11 and the n-type extremely-thin silicon region 12 exist is, surely, strong, and that there seldom occurs the light-emission from the p-type SOI region 9 or the n-type SOI region 10 whose SOI layer's film thickness is thick. This fact proves the truthfulness of the principle based on the present invention, i.e., the light-emission intensity is extremely weak in the bulk silicon; nevertheless, forming the bulk silicon into the extremely-thin silicon allows implementation of the stronger light-emission intensity. In fact, by having counted the number of photons observed by CCD based on the light-emission, it has been made clear that the light-emission intensity from the extremely-thin silicon is stronger by the amount of a few digits as compared with the light-emission intensity from the thick silicon. Also, by having made a spectroscopic analysis of the light-emission with a filter inserted, it has been made simultaneously clear that the light-emission intensity in proximity to an about 1000-nm wavelength is the highest, and that the light-emission seldom exists in proximity to an about 500-nm wavelength. This shows that the light-emission is the one caused by recombination attributed to the bandgap of the extremely-thin silicon, and is not the one caused by radiation attributed to hot electrons having high kinetic energy. Consequently, it has been proved that the principle of the present invention is true.

Next, FIG. 10A to FIG. 10F illustrate images photographed by changing magnitude of the lens used for the observation into a lower magnitude, and setting the forward biases at 0, 5, 10, 20, 30, and 40 V, respectively. These images show that, in much the say way, the light-emission is strong in the p-type extremely-thin silicon region 11 and the n-type extremely-thin silicon region 12, and that the light-emission spreads in a concentric manner. Also, as is obvious from these photographs, we have formed a large number of light-emitting devices simultaneously on the silicon substrate, i.e., we have already succeeded in implementation of the integration. It is needless to say that the use of the silicon process has resulted in a high yield of the devices.

In FIG. 10C to FIG. 10F, it looks like that the light is emitted straight ahead with a good straight-ahead property in the direction parallel to the substrate. This phenomenon, however, has a possibility of being an after-image of the CCD. Accordingly, it is dangerous to regard this phenomenon as laser oscillation decisively. In fact, in the device structure based on the present invention, the film thickness of the extremely-thin silicon film is substantially equal to or a little smaller than 10 nm. As a result, it is impossible to confine the about 1000-nm-wavelength light into this extremely-thin silicon film. It is possible, however, to confine this light into the silicon dioxide films which are adjacent to the topside and underside of this extremely-thin silicon film. In the present embodiment, the film thickness of the silicon dioxide film 8 is equal to about 90 nm, and the film thickness of the BOX 2 is equal to about 150 nm, and thus the total is equal to about 240 nm. This value is basically the same order as that of one-half wavelength amount of the light-emission wavelength within $SiO_2$, i.e., 1000/2/1.5□333 nm. It is exceedingly easy to adjust this film thickness into an integral multiple of the one-half wavelength. This is because the use of the silicon process makes it possible to control the film thickness on a-few-nm scale.

Based on these experimental data and the above-described principle, we have also devised a structure for permitting the laser oscillation to be implemented using silicon. This structure is as follows: Namely, insulating layers, such as the silicon dioxide films as indicated in the present embodiment, are made adjacent to the topside and underside of the extremely-thin silicon film which becomes the light-emitting layer. Moreover, the emitted light is confine into these insulating layers, thereby being caused to be amplified. For this purpose, as was explained in the present embodiment, it is preferable to bore a cavity in the underside of the BOX layer 2, or to form a reflection film on the underside of the BOX layer 2. As a method for forming the reflection film, e.g., it is conceivable to multi-later a plurality of films as a buried insulating film in substitution for the BOX layer 2, i.e., the buried oxide film. As materials therefor, it is conceivable to multi-later materials having different relative permittivities, e.g., silicon dioxide and silicon nitride. Otherwise, it is preferable to combine a high-permittivity material with a low-permittivity material. Moreover, it is conceivable to use silicon as the material of a waveguide when the light-emitting layer is formed of germanium or silicon-germanium. Also, it is preferable to use a metallic material as the reflection mirror. In addition, in order to permit the laser oscillation to be implemented with a high efficiency, the following structure is desirable in the cross-sectional diagram in FIG. 7: Using an anisotropy dry etching, the BOX layer 2 is cut off orthogonally to the substrate so that the width of the BOX layer 2 also becomes equal to the width W of the extremely-thin silicon film. Furthermore, an insulating film which becomes the reflection mirror is formed at both ends thereof. The structure like this can easily be formed using the silicon process. The laser according to the present invention is completely different from the structure and common sense of the conventional semiconductor lasers. Namely, in the structure of the present-invention laser, the light-emitting layer and the region into which the emitted light is confined are not identical to each other, and the light-emitting layer exists inside in such a manner that the light-emitting layer is included within the region into which the light is confined. What is referred to as "the region into which the light is confined" means the region of combination of the silicon dioxide film 8 and the BOX layer 2. Consequently, merely making only the slight amount of improvement in the light-emitting diode in the present embodiment makes it possible to fabricate the laser.

The light-emitting diode or laser disclosed in the present embodiment can be fabricated in the silicon substrate. Accordingly, the light-emitting diode or laser can be mixedly mounted with CMOS of course, and can also be mixedly mounted with the other various devices. For example, at present, devices referred to as Micro Electro Mechanical Systems (MEMS), which perform mechanically microminiaturized operations, are formed on the silicon substrate. Taking advantage of MEMS as the systems requires that MEMS be not merely operated, but also the positions thereof be detected. It is conceivable that a light-emitting device such as laser is used as a method for detecting the positions. Conventionally, however, the light-emitting device could not be used for detecting the positions, because it was impossible to cause silicon to emit light with a high efficiency. The use of the light-emitting diode or laser according to the present invention allows the positions of MEMS to be derived with a high accuracy using the already-existing silicon process. Also, the use of a mirror using MEMS makes it possible to add a new function to the chip, such as allowing the light from the light-emitting diode according to the present invention to be dynamically curved in an arbitrary direction.

Also, in addition to the fabrication method disclosed in the present embodiment, the epitaxial growth technologies can also be skillfully taken advantage of. In that case, the light-emitting diode can be fabricated without using the expensive SOI substrate. For example, a silicon substrate whose surface's plane orientation is a (111) plane is prepared. Then, a silicon-germanium film and a silicon film are epitaxially grown thereon alternately. Subsequently, p-type and n-type ion implantations are applied onto a desired region using a resist mask as is the case with the present embodiment. After that, the pattering is performed into a desired shape, e.g., rectangle as is the case with the present embodiment. Subsequently, only the layer formed of the silicon-germanium film is selectively eliminated using a washing step or the like. After that, the epitaxially-grown silicon is subjected to an oxidization processing, thereby allowing formation of an extremely-thin silicon film. At this time, $SiO_2$ is formed in a portion which becomes a cavity by the elimination of the silicon-germanium film. Since volume of $SiO_2$ is expanded at the time of the oxidization, it turns out that the cavity is substantially filled in with $SiO_2$. Applying the stress to the extremely-thin silicon film by the oxidization in this way resolves band degeneracy of the valence band. This allows acquisition of high-efficiency light with more coherent wavelength. Also, if it is wished to enhance controllability at a gate electrode, it is also preferable to permit the carrier concentration to be controlled at the gate electrode by not filling in the cavity completely, but inserting a metal gate electrode into the cavity by using CVD or the like.

In this way, by taking advantage of the epitaxial growth technologies, it becomes possible to form the light-emitting diode using basically the same extremely-thin silicon film with the use of the inexpressive substrate. Not only this, it also becomes possible to form the extremely-thin silicon film into the multi-layered structure, thereby allowing implementation of an even higher light-emission intensity. Also, if it is wished to use germanium as the light-emitting layer, a mono-crystal silicon substrate having the (111) plane is prepared. Then, similarly, the silicon-germanium film and the silicon film are epitaxially grown thereon alternately. After that, the silicon film is selectively eliminated. This process allows fabrication of an extremely-thin germanium light-emitting device having the (111) plane.

Also, the light-emitting diode indicated in the present embodiment emits the light-emission in the infrared area, which cannot be seen by the naked eye. However, by strengthening the confinement further to form the light-emitting diode into a one-dimensional structure, it becomes possible to implement the visualization. For this purpose, it is effective enough just to reform the portion equivalent to the extremely-thin silicon film indicated in the present embodiment into a narrow-wire structure by using methods such as the ordinary photolithography and dry etching. At this time, in order to maintain the light-emission efficiency, it is desirable to select the plane orientation so that band structure of the conduction band of an electron in the one-dimensional system has more density of states at the Γ point. For example, when reforming the portion into a silicon narrow wire, it is desirable to form the silicon narrow wire which is narrow in a <100> crystalline-axis direction and a <010> crystalline-axis direction or in directions equivalent thereto. The implementation of the visualization also makes it possible to form and use part of the chip as a high-luminance display. Although it may be considered that forming the display on the chip just results in implementation of too small a display, this drawback can be magnified by merely using a lens. Otherwise, the light can also be sent to a desired region by a movable mirror using MEMS. This allows fabrication of the display where silicon is a spontaneous light-emitter.

Also, the present invention is also available for wide-screen display usage. In that case, it is difficult to form the extremely-thin film by using completely mono-crystal silicon. It is possible, however, to enhance the efficiency by using poly-crystal silicon whose crystalline property is as high as possible. Since, naturally, the display must be visualized, it is desirable to employ the one-dimensional structure as described above. Forming the diode into a zero-dimensional structure, i.e., a nano-particle-stated thin film, makes it possible to shorten the wavelength further, but results in a lowering in the injection efficiency, though. In this way, the light-emitting diode according to the present embodiment can also be used as the displays.

Also, as another method for enhancing the light-emission efficiency of the light-emitting diode according to the present invention, we easily think of an idea of doping therein ions of a rare-earth element such as Er. As described earlier, the injection of the Er ions permits the expectation of the light-emission at about the 1.5-μm wavelength, i.e., the optimum wavelength for the long-distance optical communications using optical fibers. By combining the extremely-thin silicon film based on the present invention with the Er-ion injection, it becomes possible to set the wavelength at the optimum area, and to enhance the light-emission efficiency even further.

Embodiment 2

In the present embodiment, the disclosure will be made below concerning an optical interconnection and a fabrication method of fabricating the optical interconnection. Here, the above-described optical interconnection is based on information transmission performed by the light using the light-emitting device according to the first embodiment, which emits the light with a high efficiency on the chip using silicon or the like.

Figure 11:
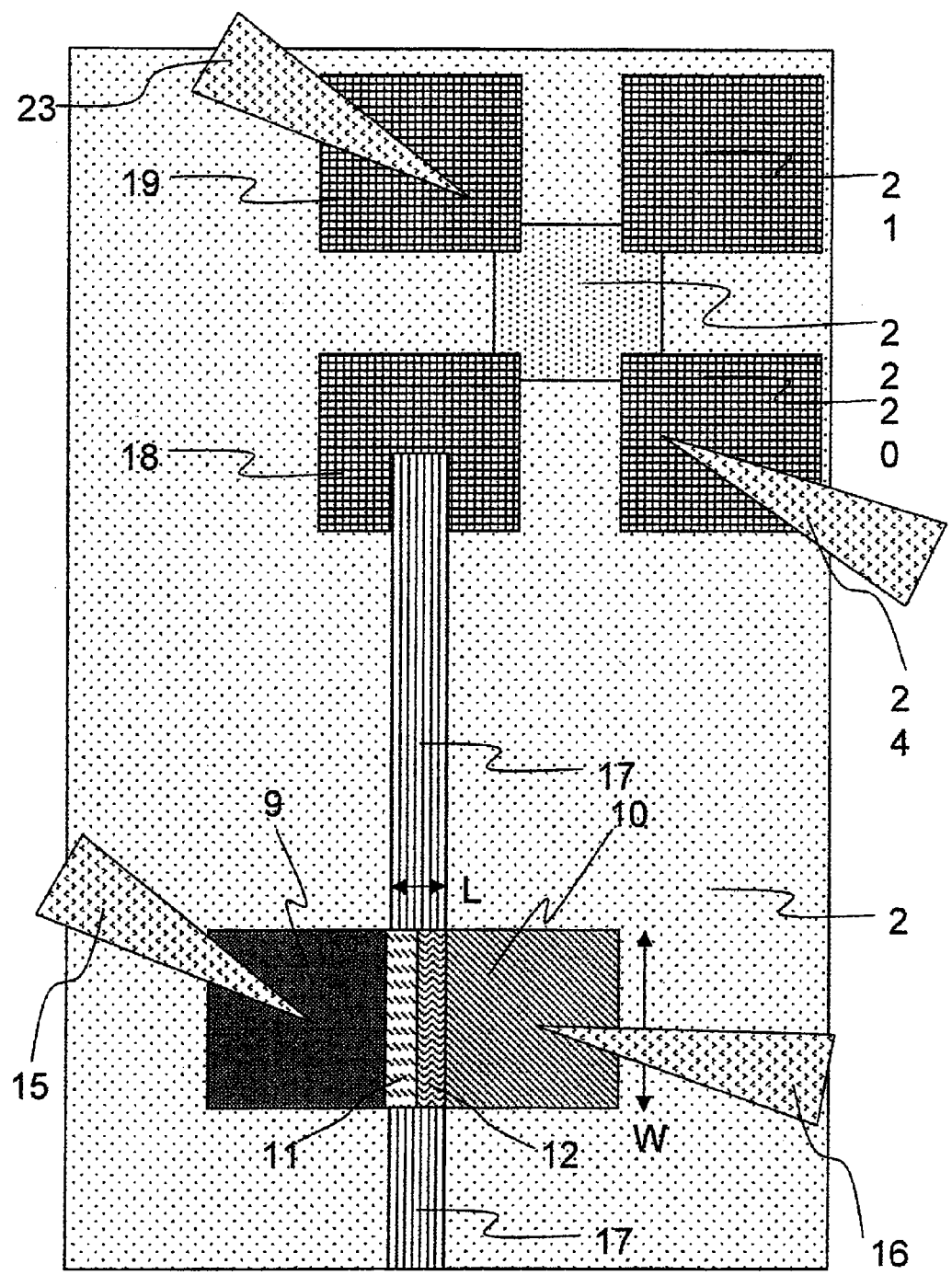
FIG. 11 is an explanatory diagram for explaining an optical interconnection verification experiment according to a second embodiment of the present invention.
Figure 12A:
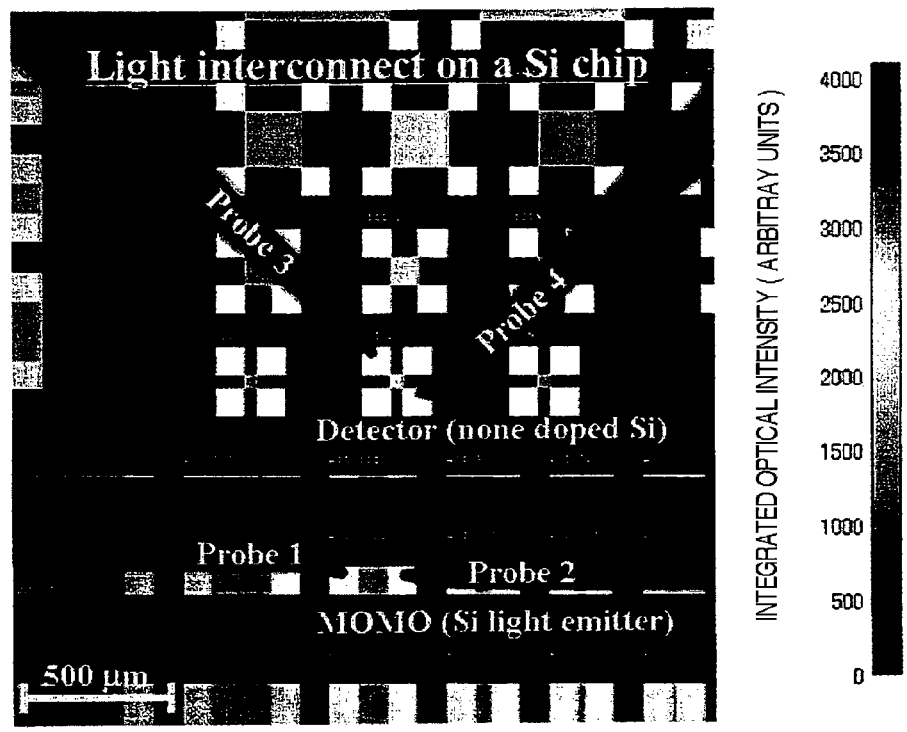
FIG. 12A is a light-emission photograph of the optical interconnection verification experiment according to the second embodiment of the present invention.
Figure 12B:
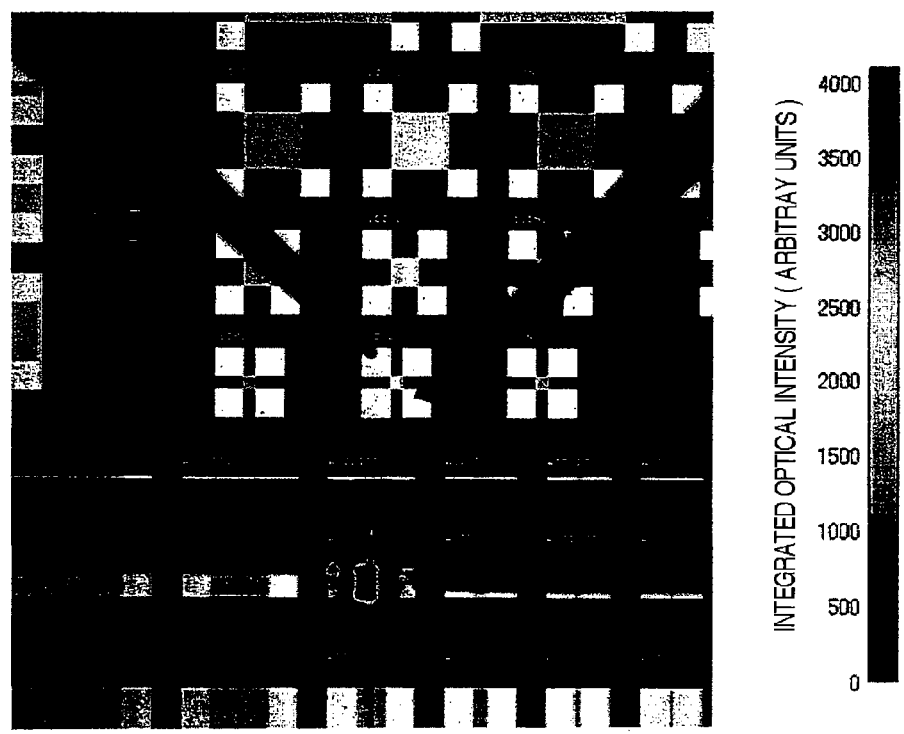
FIG. 12B is a light-emission photograph of the optical interconnection verification experiment according to the second embodiment of the present invention.
Figure 12C:
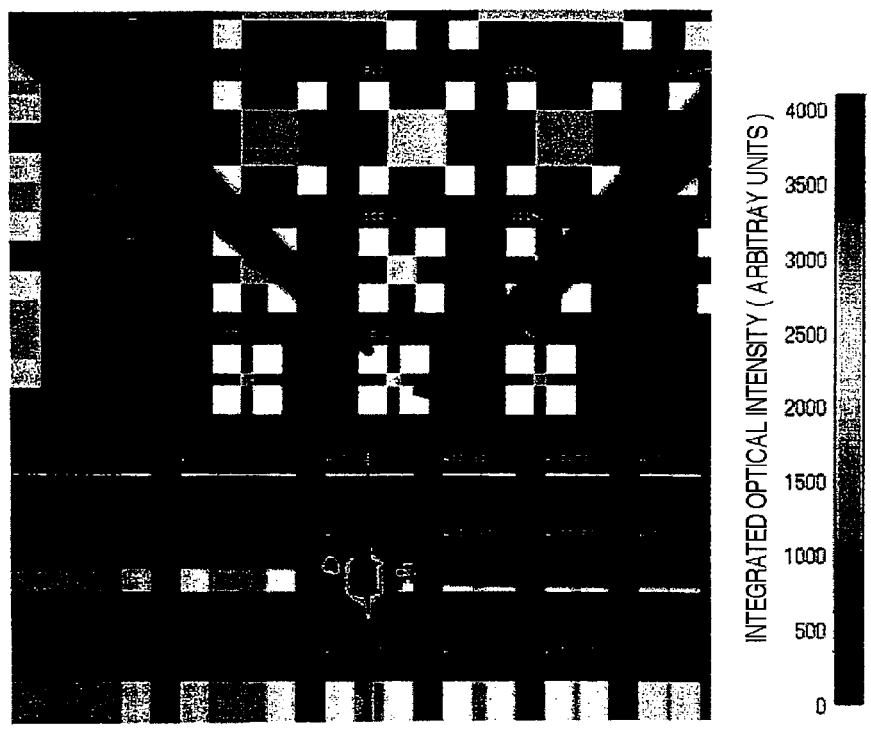
FIG. 12C is a light-emission photograph of the optical interconnection verification experiment according to the second embodiment of the present invention.
Figure 12D:
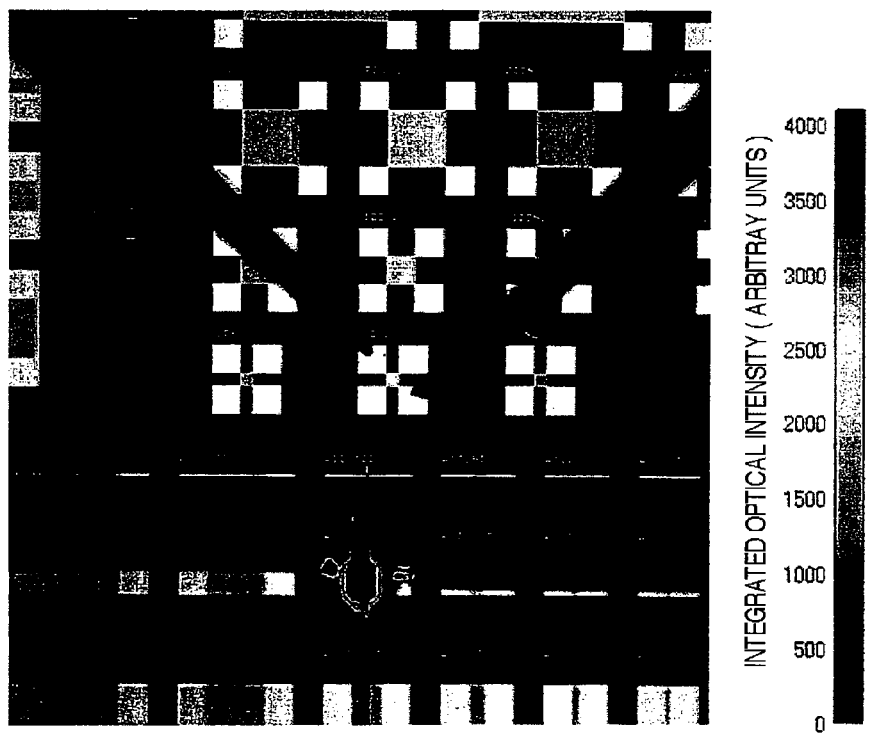
FIG. 12D is a light-emission photograph of the optical interconnection verification experiment according to the second embodiment of the present invention.
Figure 12E:
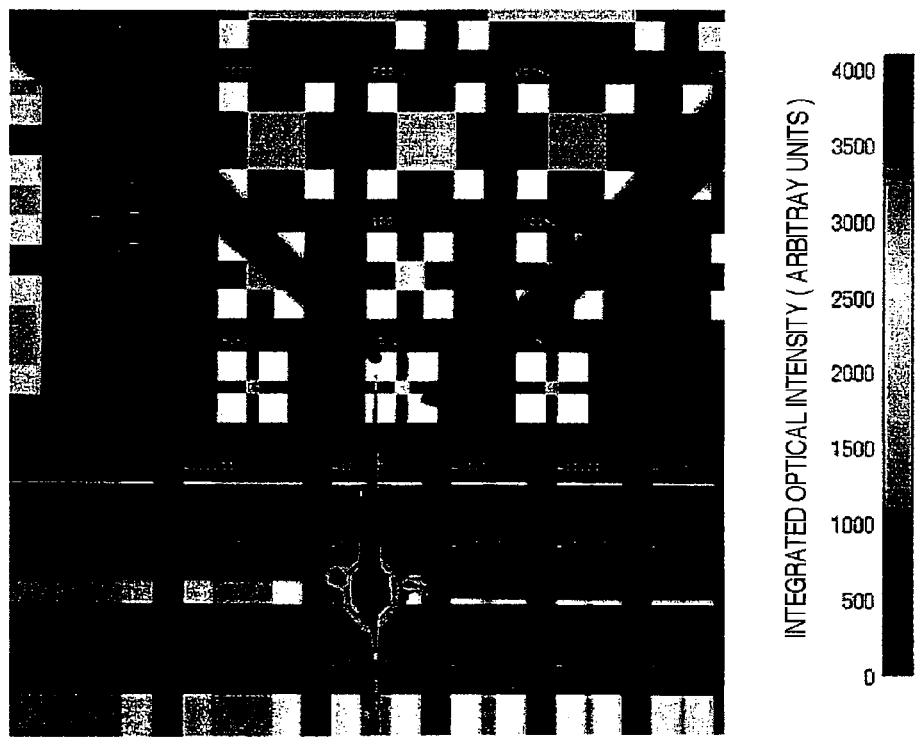
FIG. 12E is a light-emission photograph of the optical interconnection verification experiment according to the second embodiment of the present invention.
Figure 12F:
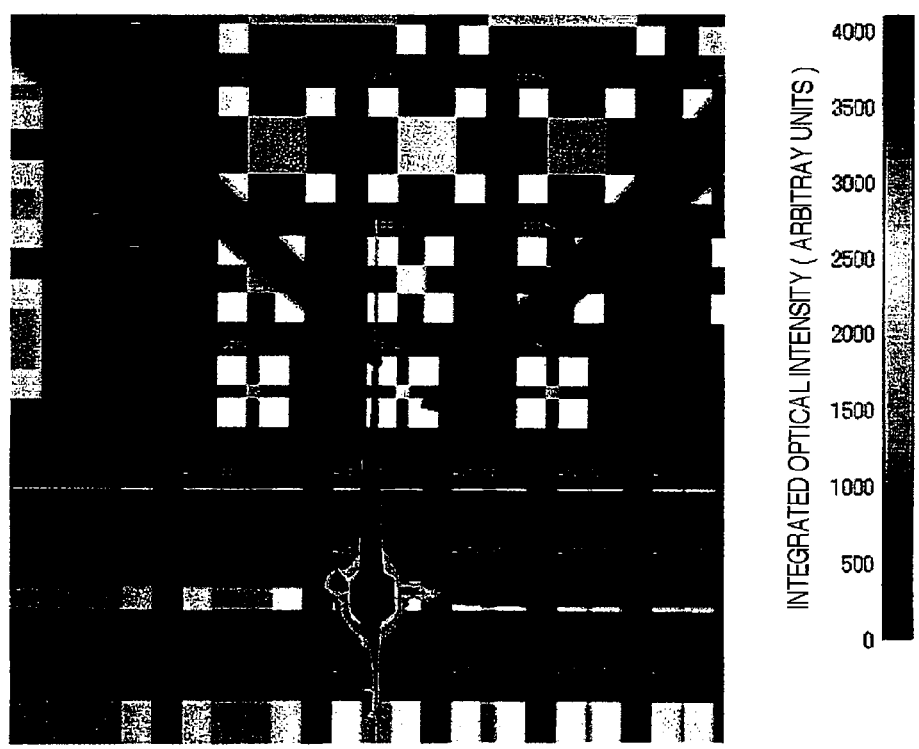
FIG. 12F is a light-emission photograph of the optical interconnection verification experiment according to the second embodiment of the present invention.

First, a silicon light-emitting diode is fabricated in accordance with fabrication steps similar to those in the first embodiment. In the silicon light-emitting diode in the present embodiment, width W of the extremely-thin silicon film is equal to 100 μm, and the length is equal to 100 μm. Also, simultaneously with the fabrication of the silicon light-emitting diode, a device illustrated on the upper side in FIG. 11 is fabricated in the region to which the ion implantation of the impurities has been not applied and in which the SOI layer has been not formed into the thin film. This device includes non-doped silicon pads 18, 19, 20, and 21, and an extremely-thin non-doped silicon 22 which is adjacent to these non-doped silicon pads and whose SOI layer is made extremely thin. In the present embodiment, the explanation will be given below regarding the following embodiment: The implementation of an optical interconnection from the silicon light-emitting diode has been made successful by using the non-doped silicon pads as a photo detector. Here, the use of the non-doped silicon pads as the photo detector is made possible by having not doped the impurities into the non-doped silicon pads.

As illustrated in FIG. 11, the non-doped silicon pads 19 and 20 are connected to probe needles 23 and 24, respectively. This connection has allowed the use of the non-doped silicon pads as the photo detector. A 5-V voltage is applied between the probe needle 23 and the probe needle 24.

Prior to the experiment, first, it has been confirmed that the non-doped silicon pad 18 is capable of detecting light in a state where the silicon light-emitting diode is not caused to emit light. For this purpose, first, it has been confirmed that no current will flow in the state where the pad is not irradiated with the light. This means that, before the irradiation with the light, carriers are absent within the silicon into which the impurities are not doped, and accordingly almost no current will flow.

Next, it has been confirmed that a photo current will flow as a result of irradiating the pad with microscope light which can be clearly confirmed by even the naked eye from the outside. The reason for this flow is as follows: The irradiation of the pad with the light causes the silicon to absorb the light therein, thereby resulting in creation of electron/hole pairs. As a result, the carriers are generated, which allows the photo current to flow. In this way, by merely providing, on the SOI substrate, the regions into which the impurities are not doped, it has become possible to form the photo detector easily.

In substitution for the simple configuration like the present embodiment, a photodiode including a p-n junction may also be formed on the region to which the light is to attain. Rather, in order to enhance the response speed to the light, it is desirable to utilize the already-existing photodiode and CCD (Charge Coupled Device). The fabrication methods for these devices have been already established, and are used for the mass production in large amount. Accordingly, in the present embodiment, these fabrication methods will not be described in detail deliberately.

Rather, what we wish to emphasize in the present embodiment is as follows: Even the use of such a very simple photo detector as the non-doped silicon pads makes it possible to easily detect the light from the silicon light-emitting diode according to the present invention. This means that we have succeeded in implementation of the optical interconnection on the silicon chip. Since we have demonstrated its principle up to this stage, it is quite easy to improve the performance from here if the technologies known at present are taken advantage of.

At first, for easy understanding, FIG. 12A to FIG. 12F illustrate the manner in which the silicon light-emitting diode is caused to emit light on the chip actually. FIG. 12A to FIG. 12F illustrate the manner of the light-emission at the time when a voltage is applied to the p-n junction of the silicon light-emitting diode in a pulse-like manner. FIG. 12A to FIG. 12F indicate the manner of the light-emission at the time when the forward bias is applied thereto by the amount of 0, 20, 40, 60, 80, and 100 V, respectively. FIG. 12A to FIG. 12F show that, the larger the forward bias becomes, the wider the light-emission region grows, and the more the light attains to the non-doped silicon pad 18.

Figure 13A:
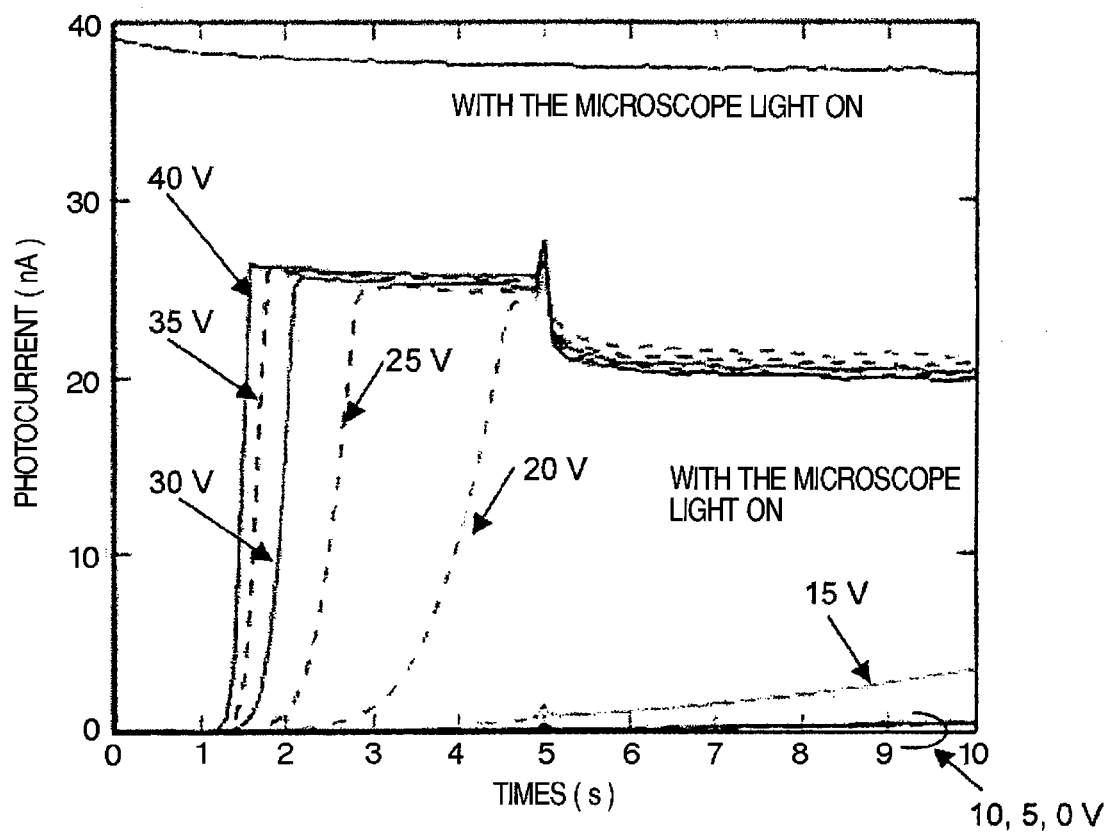
FIG. 13A and FIG. 13B illustrate the manner of a signal transmission in the optical interconnection verification experiment according to the second embodiment of the present invention.
Figure 13B:
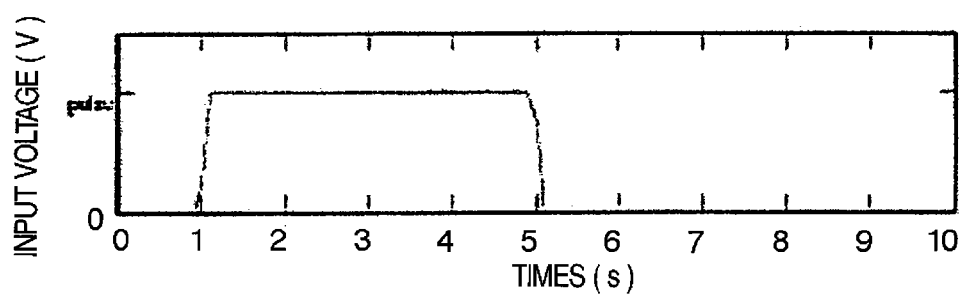

Then, next, FIG. 13A and FIG. 13B illustrate the manner in which the photo current flowing through the non-doped silicon pad is changed by the application of the pulse voltage applied to the silicon light-emitting diode. The pulse voltage is applied 1 second after from the stating of the measurement. Then, the pulse voltage continues to be applied by 4 V, and after that, the pulse voltage is switched off.

Almost no response is observed during the lower pulse voltage. It has been shown, however, that, if the pulse voltage exceeds 20V, the light attains to the pad 18 enough, and thus the signal has been able to be transmitted. When the voltage becomes even larger, the pulse time is becoming increasingly shorter and shorter. It is conceivable that the reason why an upper limit exists in the current value during the application of the pulse voltage is that the use of the non-doped silicon pads as the photo detector brings about the upper limit as the detection limit. In fact, this has been able to be confirmed by the fact as well that only about 40-nA current flows even when the pad is irradiated with stronger microscope light from the outside. Since, as described above, the silicon photodiode has been well known, enhancing this detection performance is not difficult at all.

Also, when the light is transmitted from the silicon light-emitting diode, the very large voltages of a few tens of volts have been applied thereto. The low-voltage implementation, however, is also easy in this respect. The reason for the very large voltages is that a large resistance loss exists, since the length of the extremely-thin silicon film of the silicon light-emitting diode used in the present embodiment is very long, i.e., 100 μm. The low-voltage implementation, however, is easy, because a smaller silicon light-emitting diode, which is substantially equal to or a little smaller than 0.1 μm, can be easily fabricated by using the preset-day technologies.

In this way, in the present embodiment, the formation of the optical interconnection on the silicon chip has been made successful in the very simple configuration. Here, attention must be paid to the fact that, as is obvious from the photographs or the like, the light-emitting device and the photo detection device are electrically isolated from each other completely. Namely, since, as described earlier, the SOI layer is machined into the mesa-like shape in both of the devices, the resultant SOI layers are not connected to each other. Consequently, an electrical signal can never take place in a process where an electron or a hole is transferred directly. This supports that the simple information transmission according to the present embodiment is performed via the medium of light.

In the present embodiment, however, an optical waveguide has been not formed. In this respect as well, a simple solution can be given by the combination with the conventionally-known technologies. Namely, it is effective enough just to form an optical waveguide which extends from the light-emitting device to the photo detection device. When the extremely-thin silicon film whose surface's plane orientation is the (100) plane is used as the light-emitting layer of the light-emitting diode, energy of the light becomes larger than the bandgap of silicon by the amount of the quantum confinement effect. Accordingly, the light will be easily absorbed by silicon existing in the surroundings. Consequently, it is desirable not to use silicon as a material of which the optical waveguide is formed. For example, it is devised to use silicon dioxide as the optical waveguide, and to cover the optical waveguide with a low-k material whose relative permittivity is smaller, so that the light will not leak into the surroundings. Otherwise, it is conceivable to form the optical waveguide with a nitride film often used in the silicon process. Otherwise, if the extremely-thin germanium film whose surface's plane orientation is the (111) plane is used as the light-emitting layer of the light-emitting diode, it is allowable to use the above-described substance as the optical waveguide. Otherwise, it is allowable to use silicon as the optical waveguide, and to cover the surroundings with a material whose relative permittivity is smaller than silicon, e.g., silicon dioxide or the nitride film.

Once the implementation of the optical interconnection has been found to be successful like the present embodiment, it becomes easily possible to apply the present invention to utilizations on the silicon chip, such as, e.g., achieving synchronization using a clock signal. As described earlier, unlike electric resistance, light transmission does not cause heat-liberation to occur. Accordingly, it becomes possible to transmit the clock signal with lower power consumption.

Naturally, the optical interconnection can easily be mixedly mounted with the already-existing CMOS circuits. Accordingly, in addition to the logic function based on the conventional transistors, it becomes possible to implement an on-chip optical interconnection with lower power consumption. Moreover, if the light can be extracted to the outside, an off-chip optical interconnection becomes implementable. As is shown by the photographs in the present embodiment, it has been already demonstrated to be able to extract the light to the outside. Namely, the light-emission photographs illustrated in FIG. 12A to FIG. 12F are detected by a silicon-used CCD camera. This, eventually, gives rise to a result that it has also been simultaneously demonstrated to be able to transmit the signal between the chips. Explaining this in a little more detail, if consideration is given up to the measurement system, CMOS circuits for controlling the current/voltage have been already connected to the probe needles 15 and 16. The light emitted from here is captured into the CCD camera which is not at all connected thereto with electric wirings. Then, the information processing is performed within the chip into which the CCD is integrated, thereby permitting the light look as the light-emission images. Consequently, it is no exaggeration to say that the above-described optical interconnection can be referred to as an inter-chip optical interconnection. It is needless to say that this is merely only one example, and that more complicated information processing can be performed on the silicon chip on which the light-emission is performed, and that a more complicated signal is caused to make the response at a higher speed and in a shorter time thereon. Consequently, the present invention allows implementation of the chip on which the electronic devices and the photo devices are fused with each other. This leads to implementation of a new innovation, i.e., Si photo-electronics in which the silicon-based electronics and the silicon-based photonics are fused with each other.

Embodiment 3

In the present embodiment, the disclosure will be made below concerning a light-emitting field-effect transistor whose basic configuration element is a IV semiconductor, and whose light-emission intensity or light-emission wavelength is controllable with the gate voltage, and a fabrication method of fabricating the light-emitting field-effect transistor.

The light-emitting field-effect transistors according to the present embodiment can be easily integrated on a substrate such as silicon. Accordingly, the light-emitting field-effect transistors make it possible to configure a logic circuit using light.

In the present embodiment, first, the silicon light-emitting diode is fabricated in accordance with fabrication steps similar to those in the first embodiment. Moreover, subsequently, silicon dioxide (not illustrated) attached on the surface of the silicon substrate 1 opposite to the surface adjacent to the BOX layer 2 is eliminated by being washed away using a solution containing fluoric acid. This has allowed establishment of electric conductivity to the silicon substrate 1 from the rear surface, thereby making it successful to fabricate the silicon light-emitting field-effect transistor whose back gate structure includes the silicon substrate 1.

Another method for fabricating the silicon light-emitting field-effect transistor is to form a metallic gate electrode on the topside of the silicon dioxide film 8 by using the pattering. In this case, it turns out that the gate electrode is formed on the topside of the substrate as is the case with the ordinary CMOS transistor. In that case, it is desirable to form the gate electrode as a transparent electrode whose material is, e.g., ITO (Indium-Tin-Oxide). This is because the light is reflected by the gate electrode if a not-transparent ordinary metallic gate electrode is used. Depending on propagation path of the light, however, it is preferable in some cases to use such a not-transparent metallic gate electrode. Also, poly-crystal silicon used in the ordinary silicon process may also be used as the gate-electrode material. However, when the extremely-thin mono-crystal silicon film is used as the light-emitting layer, the combination of the extremely-thin mono-crystal silicon film and the poly-crystal silicon can not necessarily be said to be the optimum combination, since the poly-crystal silicon also absorbs light. Nevertheless, there exists a merit of being capable of reducing the cost, because the commonality with the CMOS electrode can be achieved. Otherwise, the gate electrode may also be formed using the complete nickel silicidation, whose researches are being energetically performed at present. It is needless to say that selection of these materials actually results in implementation of various selective combinations, depending on cost needed for the process and the usage.

Also, when the silicon light-emitting field-effect transistor is mixedly mounted with a CMOS circuit, the CMOS circuit is formed using the ordinary silicon process. Part of the steps for forming the light-emitting diode of the present invention can be communalized with the process for forming the CMOS circuit. The part of the steps corresponds to the process of forming the gate electrode from the topside, and the process of performing the device isolation. After this, performing a desired wiring step is desirable.

Figure 14:
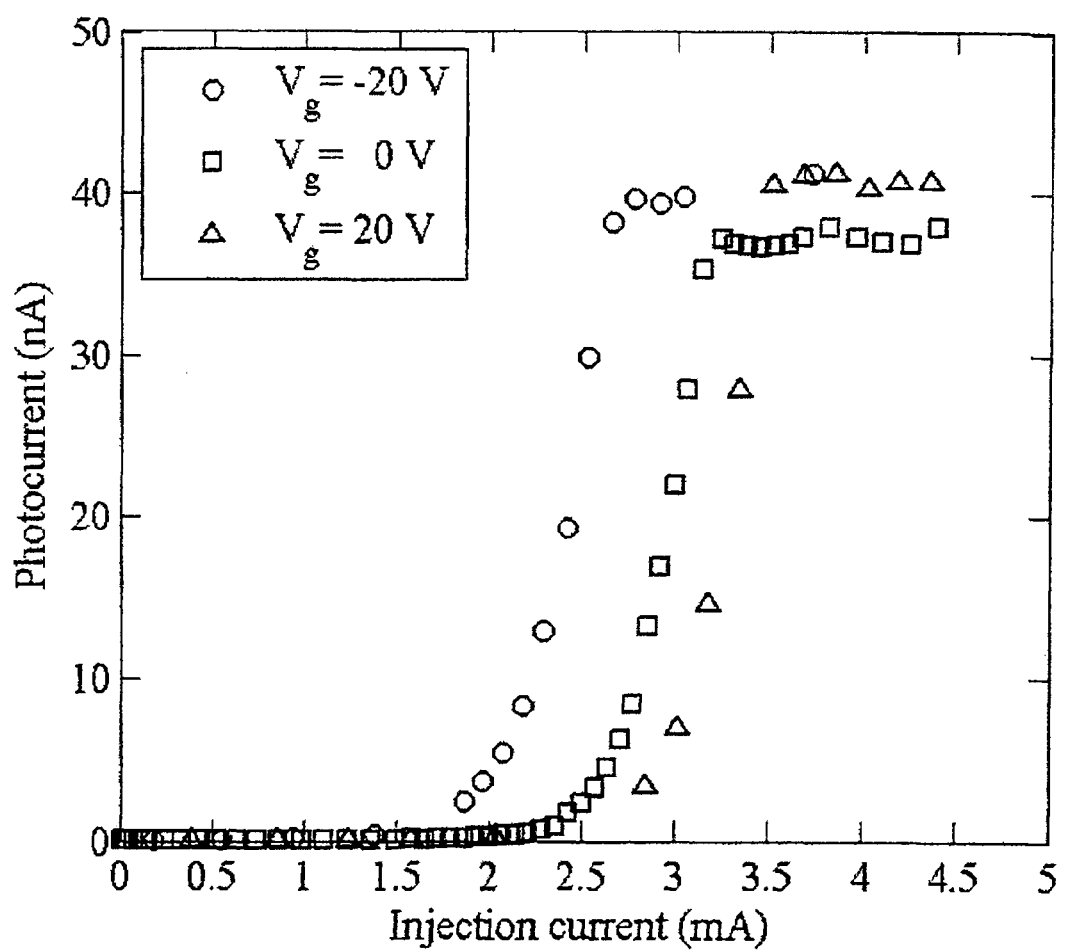
FIG. 14 illustrates the manner of a signal output in an optical transistor according to a third embodiment of the present invention.

FIG. 14 illustrates characteristics of the silicon light-emitting field-effect transistor fabricated in this way. The characteristics are obtained as follows: The field-effect transistor is caused to emit light on the chip. Then, the light emitted is detected as a photo current by using the detector indicated in the second embodiment. Moreover, the result detected is plotted in the relationship with the current injected at the time of the light-emission.

FIG. 14 shows that, as the injection current is made larger, the detector finds it easier to detect the light. The point on which attention should be focused is that it has become possible to control the photo current with the voltage applied to the back gate electrode. Namely, when the negative voltage is applied to the silicon substrate 1, the photo current is started up with the smaller injection current. In contrast thereto, when, conversely, the positive voltage is applied thereto, the output of the photo current is not started up unless the injection current is made larger. This phenomenon resembles the Id-Vd curve, which is obtained by potting the ordinary transistor characteristics as the relationship between the drain current and drain voltage, and performing a plurality of plottings with the voltage of the gate electrode changed as parameter. The point which differs therefrom is as follows: In the ordinary field-effect transistor, what is controlled is an electric current, i.e., a flow of charged particles. In the light-emitting field-effect transistor according to the present invention, on the other hand, the output of the light is controlled with the gate voltage.

In the case of the present embodiment, the output of the light is increased when the negative voltage is applied to the silicon substrate 1. The reason for this phenomenon is simple: Namely, in the fabrication steps according to the present embodiment, many of the impurities in the p-type extremely-thin silicon region 11 have dissolved into the silicon dioxide film 8, and thus the impurity concentration has been lowered. As a result, the silicon light-emitting field-effect transistor has become likely to be significantly influenced by the modulating effect by the gate voltage. In order to reform this transistor into a device which is controllable by the gate voltage with a good controllability, what is conceivable is as follows: Namely, as was described in the first embodiment, the impurity concentration of the p-type extremely-thin silicon region 11 is enhanced by, e.g., doping the p-type impurities in the manner of being divided into a plurality of times. After that, the pin diode is fabricated, then controlling the carriers in the i region as the gate electrode. At this time, it is desirable to form the gate electrode on the topside by the pattering, or it is more desirable to locate the gate electrode such that the gate electrode is in self-alignment with the i region. Such a process is made easily executable by using, e.g., damascene process. Otherwise, such a process can be addressed enough by using the ordinary silicon process, if the gate electrode is machined before the injection of the impurities. In the case of employing the latter process, it is desirable to prepare a gap layer on the topside portion of the gate electrode so that the both-type impurities will not dissolve into the topside portion of the gate electrode.

Figure 15A:
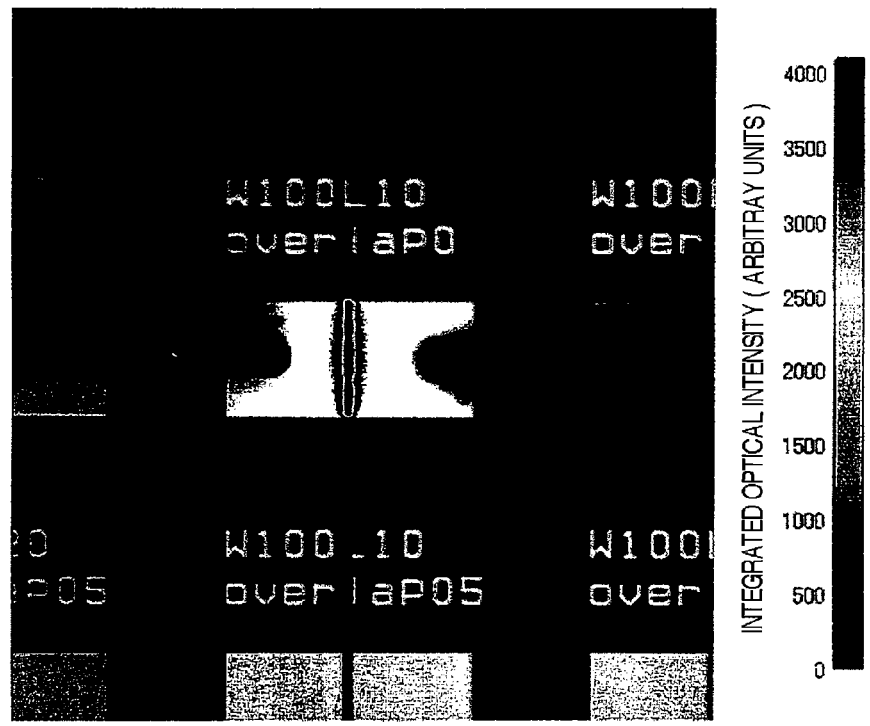
FIG. 15A is a light-emission photograph of the optical transistor according to the third embodiment of the present invention.
Figure 15B:
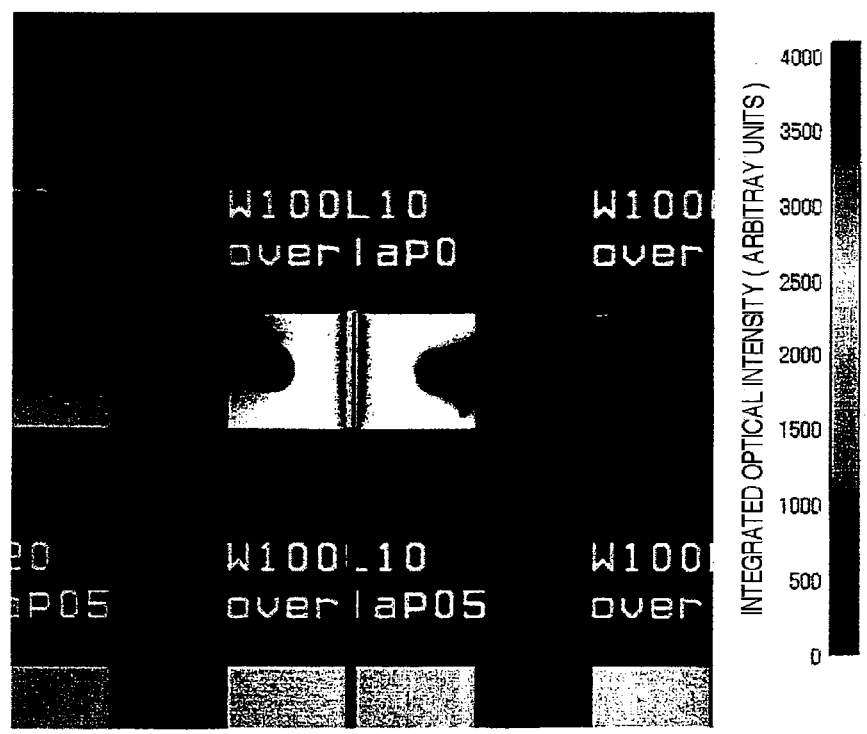
FIG. 15B is a light-emission photograph of the optical transistor according to the third embodiment of the present invention.
Figure 15C:
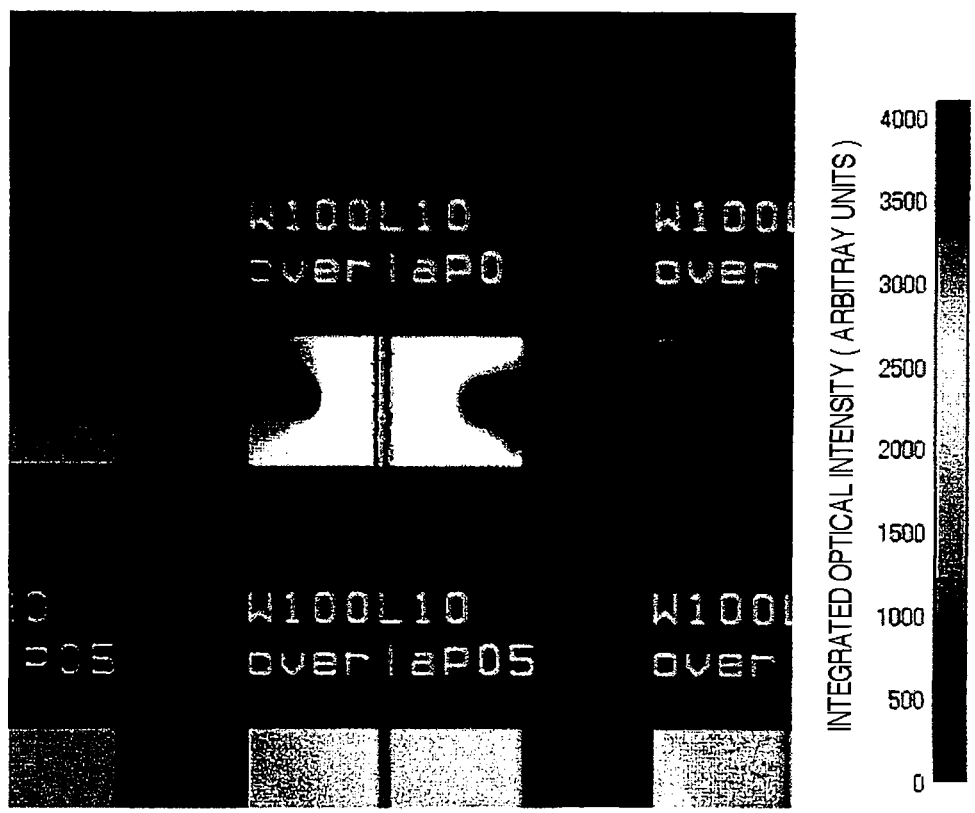
FIG. 15C is a light-emission photograph of the optical transistor according to the third embodiment of the present invention.

FIG. 15A to FIG. 15C illustrate the manner of the light-emission of the light-emitting field-effect transistor according to the present invention. FIG. 15A to FIG. 15C indicate the manner of the light-emission at the time when −10V, 0V, and 10 V are applied to the gate electrode, respectively. FIG. 15A to FIG. 15C show that, in correspondence with the characteristics in FIG. 14, the more negative the gate electrode's bias becomes, the stronger the light intensity becomes. In this way, in the light-emitting field-effect transistor according to the present invention, the light intensity can be controlled with the gate voltage. In addition, the use of the gate electrode makes it possible to strengthen the quantum confinement effect further. As a result, it becomes possible to shorten wavelength of the light emitted, or to lengthen the wavelength by weakening the gate voltage. Once it is made possible to adjust the wavelength of the light emitted, the adjusted wavelength itself can become a signal. Furthermore, a plurality of wavelength regions become able to be used for exchange of signals. Taking advantage of the wavelength modulation like this permits the operation processing to be performed using the method which is completely different from the conventional exchange of electric charges.

In addition, the plurality of light-emitting field-effect transistors according to the present invention are integrated on the chip, and further, the plurality of photo detectors are also integrated thereon. This allows implementation of the logic operation using the light-emitting field-effect transistors. In that case, since the exchange of signals can be performed with light, it becomes possible to perform information processing at a speed overwhelmingly faster than the present-day LSIs which perform the operation processing with electrons and holes. Also, it is needless to say that, since the fabrication steps are similar to those of the conventional LSIs, the light-emitting field-effect transistors and the conventional electronic devices can be integrated on one and the same chip.

Effects obtained by the above-described embodiments will be described hereinafter.

As is well known, the light-emission efficiency depends on the crystalline property. Accordingly, unless the substrate includes less defects and has a good crystalline property, it is impossible to obtain the light-emission efficiency which is high enough for the practical commercialization. In the conventional methods, it has been found difficult to enhance the crystalline property. In contrast thereto, in the present invention, the mono-crystal substrate which has a good crystalline property from the beginning is used and machined. Accordingly, the crystalline property is good enough in the present invention, which allows the enhancement in the light-emission efficiency. The fabrication of the light-emitting diode according to the present invention is realistic from the viewpoint of execution of its mass production as well. Consequently, its early-stage practical commercialization can be expected.

Also, by taking advantage of the silicon light-emitting diode according to the present invention, it becomes possible to provide a chip and a fabrication method of fabricating the chip. Here, on the above-described chip, devices, whose basic configuration element is a IV semiconductor and which emit light with a high efficiency, and light-receiving devices are integrated with a good yield on a substrate such as silicon.

Also, by taking advantage of devices which emit light with a high efficiency on a chip using silicon or the like, information transmission by light is implemented. This implementation allows implementation of an optical interconnection. Since light has no electric charge, light is capable of transmitting information without causing electric resistance to occur. This makes it possible to solve the serious problem in the conventional technologies, i.e., an increase in the electric resistance gives rise to an increase in power consumption.

Moreover, it becomes possible to provide a light-emitting field-effect transistor, whose basic configuration element is a IV semiconductor and whose light-emission intensity or light-emission wavelength is controllable with the gate voltage, and a fabrication method of fabricating the light-emitting field-effect transistor. The use of the light-emitting field-effect transistor allows the light-emission intensity or light-emission wavelength to be directly modulated with the gate voltage. Furthermore, by integrating the light-emitting field-effect transistors on a substrate such as silicon, it becomes possible to provide a logic circuit using light and a fabrication method of fabricating the logic circuit.

It should be further understood by those skilled in the art that although the foregoing description has been made on embodiments of the present invention, the invention is not limited thereto and various changes and modifications may be made without departing from the spirit of the invention and the scope of the appended claims.

The invention claimed is:

1. A light-emitting device, comprising:
a first electrode for injecting an electron,
a second electrode for injecting a hole,
an insulating material, and
first and second light-emitting units electrically connected to said first electrode and said second electrode, respectively, wherein
said first electrode, said second electrode, said first light-emitting unit, and said second light-emitting unit are composed of the same single-crystal material,
the single-crystal material is silicon,
the first and second light-emitting units each have a film thickness that is less than a film thickness of both the first and second electrodes,
the corresponding film thickness of each of the first and second light emitting units is equal to 10 nm or less,
the first and second electrodes and the first and second light-emitting units are disposed over a main surface of a substrate,
a bottom edge of the first light-emitting unit is aligned and coplanar with a bottom edge of the second light-emitting unit in a plane parallel to the main surface of the substrate, and
a plane orientation of a top surface of each of the first and second light-emitting units is a (100) plane or a plane orientation equivalent to said (100) plane.

2. The light-emitting device according to claim 1, wherein said first light-emitting unit is a p-type semiconductor region,
said second light-emitting unit is an n-type semiconductor region, and
a difference between the film thicknesses of said first light-emitting unit and said second light-emitting unit is equal to 5 nm or less.

3. The light-emitting device according to claim 1, wherein said top surface is in contact with said insulating material.

4. The light-emitting device according to claim 3, wherein said insulating material is silicon dioxide.

5. The light-emitting device according to claim 1, wherein said first light-emitting unit is a p-type semiconductor region, and
said second light-emitting unit is an n-type semiconductor region; and
further comprising a third light-emitting unit, which is an i-type semiconductor region formed between said first and second light-emitting units.

6. The light-emitting device according to claim 1, wherein the first electrode, the second electrode, the first light-emitting unit, and the second light-emitting unit are an integrally formed, monolithic piece of single crystal silicon material.

7. The light-emitting device according to claim 1, wherein the first and second light-emitting units and the first and second electrodes are arranged in the following order in plan view of the substrate: the first electrode, the first light-emitting unit, the second light-emitting unit, the second electrode.

* * * * *